(12) United States Patent
Choi et al.

(10) Patent No.: US 12,315,865 B2
(45) Date of Patent: May 27, 2025

(54) LIGHT-EMITTING DIODE DISPLAY DEVICE AND MANUFACTURING METHOD THEREOF

(71) Applicant: SAMSUNG ELECTRONICS CO., LTD., Suwon-si (KR)

(72) Inventors: Junhee Choi, Seongnam-si (KR); Jinjoo Park, Yongin-si (KR); Kiho Kong, Suwon-si (KR); Junghun Park, Yongin-si (KR); Eunsung Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 505 days.

(21) Appl. No.: 17/480,802

(22) Filed: Sep. 21, 2021

(65) Prior Publication Data

US 2022/0093824 A1   Mar. 24, 2022

Related U.S. Application Data

(60) Provisional application No. 63/081,568, filed on Sep. 22, 2020.

(30) Foreign Application Priority Data

| Nov. 30, 2020 | (KR) | .................. | 10-2020-0165077 |
| Mar. 8, 2021 | (KR) | .................. | 10-2021-0030392 |

(51) Int. Cl.
*H01L 33/08* (2010.01)
*H01L 27/15* (2006.01)
(Continued)

(52) U.S. Cl.
CPC ............ *H01L 33/08* (2013.01); *H01L 27/156* (2013.01); *H01L 33/005* (2013.01); *H01L 33/382* (2013.01)

(58) Field of Classification Search
CPC . H01L 21/182; H01L 21/2654; H01L 21/266; H01L 27/15; H01L 27/156; H01L 33/005; H01L 33/08; H01L 33/382
See application file for complete search history.

(56) References Cited

U.S. PATENT DOCUMENTS

| 7,943,954 B2 | 5/2011 | Wu et al. |
| 10,629,689 B1 | 4/2020 | Raring et al. |

(Continued)

FOREIGN PATENT DOCUMENTS

| EP | 3660900 A1 | 6/2020 |
| JP | 5491439 B2 | 5/2014 |

(Continued)

OTHER PUBLICATIONS

Slotte, J., et al., "Fluence. flux, and implantation temperature dependence of ion-implantation-induced defect production in 4H-SiC", Journal of Applied Physics, vol. 97, 2005, pp. 033513-1 to 033513-7 (8 pages).

(Continued)

*Primary Examiner* — Julia Slutsker
*Assistant Examiner* — Dmitriy Yemelyanov
(74) *Attorney, Agent, or Firm* — Sughrue Mion, PLLC

(57) ABSTRACT

A display device includes an ion implantation region, a first semiconductor layer, an active layer under the first semiconductor layer, and a second semiconductor layer under the active layer. The ion implantation region includes a plurality of ions and partitions the active layer into a plurality of light-emitting regions, and an average ion concentration ratio of each of the light-emitting regions is 2 to 15.

20 Claims, 26 Drawing Sheets

(51) Int. Cl.
*H01L 33/00* (2010.01)
*H01L 33/38* (2010.01)

(56) References Cited

U.S. PATENT DOCUMENTS

| | | | |
|---|---|---|---|
| 2004/0175852 A1* | 9/2004 | Ooi | H01L 21/182 438/22 |
| 2012/0292629 A1 | 11/2012 | Wu et al. | |
| 2015/0187991 A1* | 7/2015 | McGroddy | H01L 24/95 257/13 |
| 2016/0336484 A1 | 11/2016 | McGroddy et al. | |
| 2019/0189682 A1* | 6/2019 | Young | H01L 33/62 |
| 2020/0227592 A1* | 7/2020 | Zhang | H01L 33/60 |
| 2021/0375983 A1 | 12/2021 | Choi et al. | |

FOREIGN PATENT DOCUMENTS

| | | |
|---|---|---|
| KR | 1020020076847 A | 10/2002 |
| KR | 1020130044909 A | 5/2013 |
| KR | 101275875 B1 | 6/2013 |
| KR | 10-2020-0062863 A | 6/2020 |
| WO | 2017/184686 A1 | 10/2017 |

OTHER PUBLICATIONS

Kucheyev, S.O., et al., "Cathodoluminescence depth profiling of ion-implanted GaN", Applied Physics Letters, vol. 78, No. 1, Jan. 1, 2001, pp. 34-36 (4 pages).

Communication issued Feb. 15, 2022 by the European Patent Office in European Patent Application No. 21194343.6.

Communication dated Jan. 22, 2025, issued by the Korean Patent Office in Korean Application No. 10-2021-0030392.

* cited by examiner

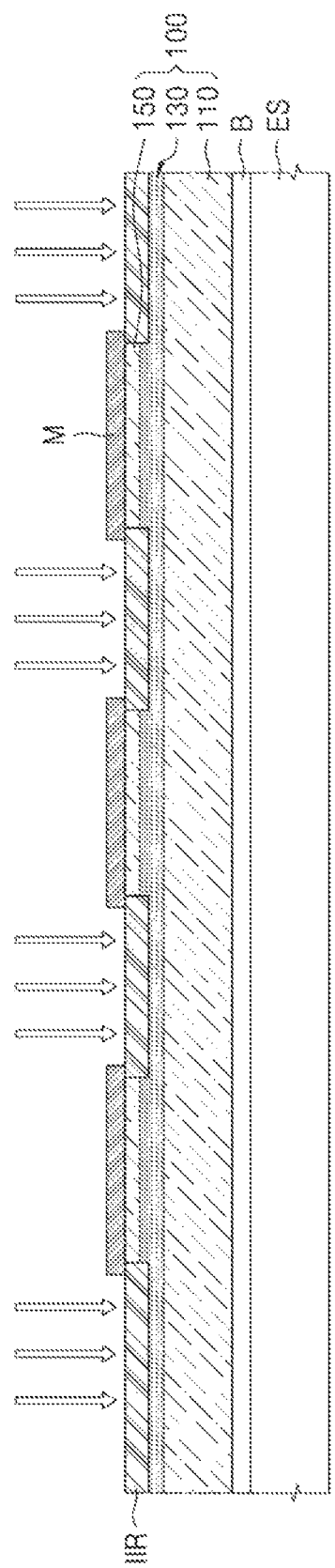

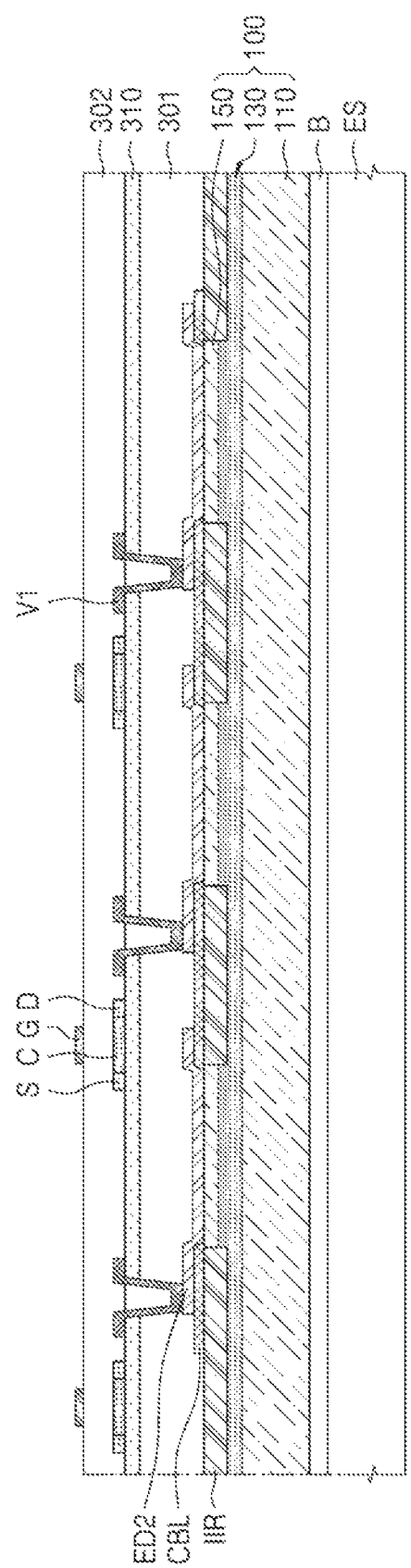

LIGHT-EMITTING DIODE DISPLAY DEVICE AND MANUFACTURING METHOD THEREOF

CROSS-REFERENCE TO RELATED APPLICATIONS

This application is based on and claims priority under 35 U.S.C. § 119 to Korean Patent Application No. 10-2020-0165077, filed on Nov. 30, 2020, in the Korean Intellectual Property Office, Korean Patent Application No. 10-2021-0030392, filed on Mar. 8, 2021, in the Korean Intellectual Property Office, and Provisional U.S. Patent Application No. 63/081,568, filed on Sep. 22, 2020, in the United States Patent and Trademark Office, the disclosure of which is incorporated by reference herein in its entirety.

BACKGROUND

1. Field

The disclosure relates to a display device using a light-emitting diode, and more particularly, to a display device with improved resolution and refresh rate and a manufacturing method thereof.

2. Description of the Related Art

Liquid crystal displays (LCDs), organic light-emitting diode (OLED) displays, and the like are widely used as display devices. Recently, devices with improved resolution and refresh rate are required to be suitable for virtual reality and augmented reality displays.

SUMMARY

Provided is a structure of a display device with high resolution and refresh rate, and a manufacturing method thereof.

Additional aspects will be set forth in part in the description which follows and, in part, will be apparent from the description, or may be learned by practice of embodiments of the disclosure.

In accordance with an aspect of the disclosure, a display device includes a first semiconductor layer; an active layer under the first semiconductor layer; a second semiconductor layer under the active layer; and an ion implantation region including a plurality of ions, the ion implantation region partitioning the active layer into a plurality of light-emitting regions, wherein an average ion concentration ratio of the plurality of light-emitting regions is 2 to 15.

The average ion concentration ratio of the plurality of light-emitting regions may be 4 to 10.

An ion concentration ratio of each of the plurality of light-emitting regions may be 20 or less.

Each of the plurality of light-emitting regions may include a continuous section having a length of 1 µm or more in which an ion concentration ratio is 5 or less.

Each of the plurality of ions may have a mass greater than a mass of a nitrogen ion.

The plurality of ions may include Ar ions.

In accordance with an aspect of the disclosure, a display device includes a first semiconductor layer; an active layer under the first semiconductor layer; a second semiconductor layer under the active layer; and an ion implantation region on the second semiconductor layer and the active layer, wherein a concentration peak of ions implanted into the ion implantation region is located at a level below an upper surface of the second semiconductor layer.

The ion implantation region may have an ion distribution that gradually increases and then decreases from a surface of the second semiconductor layer in a direction toward the active layer.

A plurality of ions may be implanted in the ion implantation region, and each ion of the plurality of ions may have a mass greater than a mass of a nitrogen ion.

A plurality of ions may be implanted in the ion implantation region, and the plurality of ions may include Ar ions.

The first semiconductor layer may include an n-type semiconductor layer, and the second semiconductor layer may include a p-type semiconductor layer.

In accordance with an aspect of the disclosure, a method of manufacturing a display device includes forming an active layer on a first semiconductor layer; forming a second semiconductor layer on the active layer; forming a mask for ion implantation on the second semiconductor layer; and implanting ions into an open area of the mask, wherein the implanting of the ions is performed at a process temperature of 75° C. to 130° C.

The process temperature may be 90° C. to 110° C.

In the implanting of the ions, the ions may be implanted with implantation energy of less than 8 keV.

Each ion of the ions may have a mass greater than a mass of a nitrogen ion.

The ions may include Ar ions.

The mask may include a Ti mask.

A thickness of the mask may be 100 nm to 300 nm.

A thickness of the mask may be 200 nm to 250 nm.

In accordance with an aspect of the disclosure, an electronic apparatus includes a display device configured to output image information; and a processor configured to control an operation of the display device and transmit image information to the display device, wherein the display device includes a first semiconductor layer; an active layer under the first semiconductor layer; a second semiconductor layer under the active layer; and an ion implantation region comprising a plurality of ions, the ion implantation region partitioning the active layer into a plurality of light-emitting regions, wherein an average ion concentration ratio of the plurality of light-emitting regions is 2 to 15.

The average ion concentration ratio of the plurality of light-emitting regions may be 4 to 10.

An ion concentration ratio of each of the plurality of light-emitting regions may be 20 or less.

Each of the plurality of light-emitting regions may include a continuous section having a length of 1 µm or more in which an ion concentration ratio is 5 or less.

Each ion of the plurality of ions may have a mass greater than a mass of a nitrogen ion.

The plurality of ions may include Ar ions.

In accordance with an aspect of the disclosure, a display device includes a semiconductor layer; an active layer on the semiconductor layer; and a plurality of ions in the semiconductor layer and the active layer, wherein a light-emitting region of the display device includes a first portion of the semiconductor layer and a second portion of the active layer, the second portion being directly under the first portion, and wherein a concentration of the plurality of ions in the light-emitting region is less than a concentration of the plurality of ions in a non-light-emitting region of the display device.

An average ion concentration ratio of the light-emitting region may be 2 to 15.

The display device may further include another semiconductor layer on the active layer; a first electrode in the another semiconductor layer above the non-light-emitting region; and a second electrode under the light-emitting region and contacting the semiconductor layer.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 4A to 4L are cross-sectional views for describing a method of manufacturing the display device of FIG. 1;

DETAILED DESCRIPTION

Figure 1:
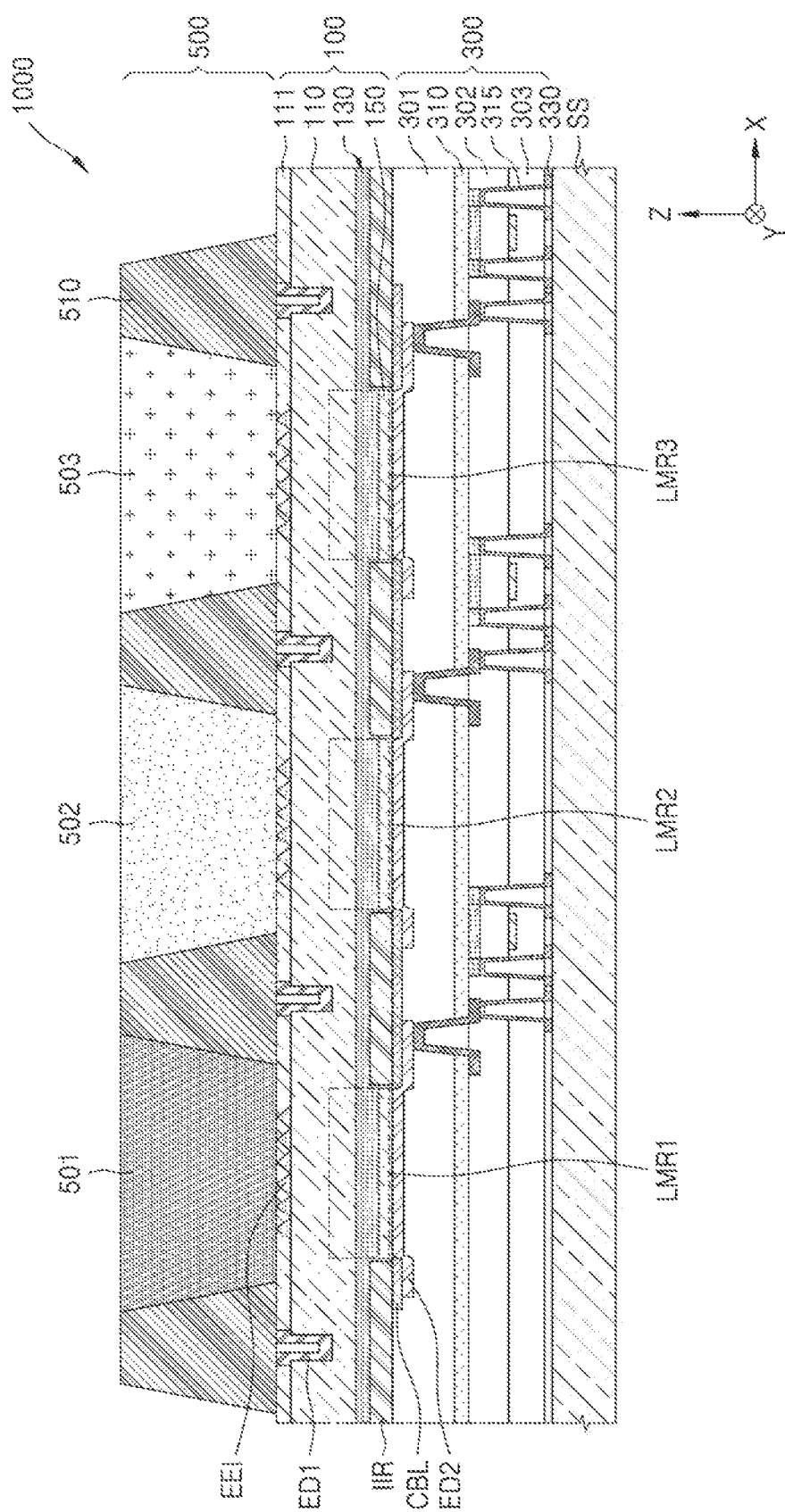
FIG. 1 is a schematic cross-sectional view of a display device according to an example embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

A light-emitting diode display device and a manufacturing method thereof are described below in detail with reference to the accompanying drawings. Embodiments described below are merely examples, and various modifications therefrom are available. Throughout the drawings, like reference numerals refer to like elements. The thickness or size of each layer illustrated in the drawings may be exaggerated for convenience of explanation and clarity.

When a constituent element is disposed "above" or "on" another constituent element, the constituent element may include not only an element directly contacting on the upper/lower/left/right sides of the other constituent element, but also an element disposed above/under/left/right the other constituent element in a non-contact manner.

Terms such as "first" and "second" are used herein merely to describe a variety of constituent elements, but the constituent elements are not limited by the terms. Such terms are used only for the purpose of distinguishing one constituent element from another constituent element. The terms do not limit that the material or structure of the constituent elements are different from one another.

An expression used in the singular encompasses the expression of the plural, unless it has a clearly different meaning in the context. It will be further understood that the terms "comprises" and/or "comprising" used herein specify the presence of stated features or components, but do not preclude the presence or addition of one or more other features or components.

Furthermore, terms such as "~ portion," "~ unit," "~ module," and "~ block" stated in the specification may signify a unit to process at least one function or operation and the unit may be embodied by hardware, software, or a combination of hardware and software.

The use of the terms "a" and "an" and "the" and similar referents in the context of describing the disclosure are to be construed to cover both the singular and the plural.

Also, the steps of all methods described herein can be performed in any suitable order unless otherwise indicated herein or otherwise clearly contradicted by context. The disclosure is not limited to the described order of the steps. Furthermore, the use of any and all examples, or language (e.g., "such as") provided herein, is intended merely to better illuminate the disclosure and does not pose a limitation on the scope of the disclosure unless otherwise claimed.

FIG. 1 is a schematic cross-sectional view of a display device 1000 according to an embodiment.

Referring to FIG. 1, the display device 1000 may include a light-emitting element layer 100 having a plurality of light-emitting regions for generating light, a driving layer 300 having a circuit for driving the light-emitting regions, a wavelength conversion layer 500 for converting a wavelength of the light generated from the light-emitting regions, and a support substrate SS supporting the driving layer 300.

The support substrate SS may physically support the driving layer 300, and may not be a semiconductor growth substrate. The support substrate SS may include, for example, a silicon substrate, a glass substrate, a sapphire substrate, or a silicon substrate coated with $SiO_2$.

The driving layer 300 may include an active layer 310, in which a driving device 315 for electrically driving the light-emitting regions is formed, and one or a plurality of insulating layers 301, 302, 303. The driving device 315 may include, for example, a transistor, a thin film transistor (TFT), or a high electron mobility transistor (HEMT). The driving device 315 may include a gate electrode G, a source electrode S, and a drain electrode D (see, e.g., FIG. 4H).

A bonding layer 330, for example, an adhesive layer or a direct bonding layer, may be arranged between the support substrate SS and the driving layer 300. The adhesive layer may include, for example, epoxy, spin on glass (SOG), benzocyclobutene (BCB), or the like. The direct bonding layer may be formed by, for example, plasma, ion beam processing, or the like. The bonding layer 330 for physically bonding the support substrate SS to the driving layer 300 may bond the support substrate SS and the driving layer 300 without electrical connection therebetween.

The light-emitting element layer 100 may include a micro light emitting diode (LED) array. The light-emitting element layer 100 may include a first semiconductor layer 110, an active layer 130, a second semiconductor layer 150 (e.g., a semiconductor layer), a first electrode ED1, and a second electrode ED2.

The first semiconductor layer 110 may include an n-type semiconductor or a p-type semiconductor. A case in which the first semiconductor layer 110 includes a group III-V-based n-type semiconductor is described as an example. The first semiconductor layer 110 may be a layer including n-GaN and may have a single layer or multilayer structure. A light exit surface of the first semiconductor layer 110 may have an uneven structure EEI. The uneven structure EEI may include a plurality of protrusion portions that improve a light emission efficiency, and each of the protrusion portions may have a polygonal pyramid shape or a cone shape.

The active layer 130 may be arranged to contact the first semiconductor layer 110. The active layer 130 may be below the first semiconductor layer 110 as shown in FIG. 1. The active layer 130 may have a multi-quantum well (MQW) or single-quantum well (SQW) structure in which light is generated as electrons and holes combine with each other. The active layer 130 may include a group III-V-based semiconductor, for example, GaN.

The second semiconductor layer 150 may be arranged to contact the active layer 130. The second semiconductor layer 150 may be below the active layer 130 as shown in FIG. 1. The second semiconductor layer 150 may include a group III-V-based p-type semiconductor, for example, p-GaN. The second semiconductor layer 150 may have a single layer or multilayer structure.

The light-emitting element layer 100 may include an ion implantation region IIR (e.g., a non-light-emitting region) that partitions the active layer 130 into a plurality of first, second, and third light-emitting regions LMR1, LMR2, and LMR3. In other words, the ion implantation region IIR may be provided between adjacent ones of the first, second, and third light-emitting regions LMR1, LMR2, and LMR3. A plurality of ions may be implanted in the ion implantation region. The implanted ions may include an element heavier than a nitrogen (N) ion, for example, an argon (Ar) ion. As no current flows in the ion implantation region IIR, the first, second, and third light-emitting regions LMR1, LMR2, and LMR3, which independently operate without a mesa structure, may be formed. In other words, by using the ion implantation region IIR through ion implantation, the first, second, and third light-emitting regions LMR1, LMR2, and LMR3 may be formed without an etching process, and thus the first, second, and third light-emitting regions LMR1, LMR2, and LMR3 may be manufactured in small sizes and a high resolution micro light-emitting device array may be implemented.

The light-emitting element layer 100 may include the first electrode ED1 electrically connected to the first semiconductor layer 110 and the second electrode ED2 electrically connected to the second semiconductor layer 150. The first electrode ED1 may be a common electrode, and the second electrode ED2 may be a pixel electrode. When the first and second semiconductor layers 110 and 150 respectively include an n-type semiconductor and a p-type semiconductor, the first and second electrodes ED1 and ED2 may be an n-type electrode and a p-type electrode, respectively. A driving device 315 is electrically connected to the second electrode ED2 and may control turning the first, second, and third light-emitting regions LMR1, LMR2, and LMR3 on-off. In other words, one or a plurality of the first, second, and third light-emitting regions LMR1, LMR2, and LMR3 may be optionally driven by using the driving device 315.

The first electrode ED1 may be formed by a transparent electrode or an opaque electrode. The transparent electrode may include, for example, an indium tin oxide (ITO), ZnO, an indium zinc oxide (IZO), IGZO, and the like. When the first electrode ED1 is a transparent electrode, the first electrode ED1 may be arranged to entirely cover the first semiconductor layer 110. When the first electrode ED1 is an opaque electrode, the first electrode ED1 may include a window area through which light emitted from the first, second, and third light-emitting regions LMR1, LMR2, and LMR3 is transmitted.

The second electrode ED2 may include a reflective material, for example, Ag, Au, Al, Cr, Ni, or an alloy thereof, to reflect the light emitted from the first, second, and third light-emitting regions LMR1, LMR2, and LMR3 in a direction opposite to a light exit surface (−Z direction). A current blocking layer CBL may be further provided at both end portions of the second electrode ED2. The current blocking layer CBL may prevent a current from leaking into an adjacent other light-emitting region. The current blocking layer CBL may include a silicon oxide or a silicon nitride, for example, $SiO_2$. The current blocking layer CBL may be arranged at a position corresponding to the ion implantation region IIR, and between a lower surface of the ion implantation region IIR and the second electrode ED2 as shown in FIG. 1.

The wavelength conversion layer 500 may be arranged at a light exit surface side of the light-emitting element layer 100, and may include a plurality of wavelength conversion portions 501, 502, and 503 that convert the light emitted from the first, second, and third light-emitting regions LMR1, LMR2, and LMR3 into light beams of different colors. The operation of the wavelength conversion layer 500 is described below with an example in which all of the first, second, and third light-emitting regions LMR1, LMR2, and LMR3 emit blue light.

The wavelength conversion portions 501, 502, and 503 may be respectively arranged to correspond to the first, second, and third light-emitting regions LMR1, LMR2, and LMR3. The wavelength conversion portions 501, 502, and 503 may include, for example, a blue wavelength conversion portion 501, a green wavelength conversion portion 502, and a red wavelength conversion portion 503. The blue wavelength conversion portion 501, the green wavelength conversion portion 502, and the red wavelength conversion portion 503 may correspond to the first light-emitting region LMR1, the second light-emitting region LMR2, and the third light-emitting region LMR3, respectively.

The blue wavelength conversion portion 501 may be a transmission layer that transmits blue light emitted from the first light-emitting region LMR1, as blue light, to the outside. The blue wavelength conversion portion 501 may include photoresist exhibiting excellent transmission characteristics and/or a light scattering agent.

The green wavelength conversion portion 502 may convert blue light emitted from the second light-emitting region LMR2 into green light. The green wavelength conversion portion 502 may include quantum dots (QDs) or a fluorescent substance having a certain size and emitting green light by being excited by blue light.

The quantum dot may have a core-shell structure having a core part and a shell part, or a particle structure having no shell. The core-shell structure may include a single-shell or a multi-shell, for example, a double-shell. The quantum dot may include one or a plurality of a group II-VI based semiconductor, a group III-V-based semiconductor, a group IV-VI based semiconductor, a group IV based semiconductor, and a graphene quantum dot, for example, one or a plurality of Cd, Se, Zn, S, and InP. Each quantum dot may have a diameter of several tens of nanometers or less, for example, about 10 nm or less.

The green wavelength conversion portion 502 may further include photoresist exhibiting excellent transmission characteristics and/or a light scattering agent for allowing green light to be uniformly emitted.

The red wavelength conversion portion 503 may convert blue light emitted from the third light-emitting region LMR3 into red light. The red wavelength conversion portion 503 may include a quantum dot or fluorescent substance having a certain size and emitting red light by being excited by blue light, and may further include photoresist and/or a light scattering agent.

The wavelength conversion portions 501, 502, and 503 may have a cross-sectional shape having a width that increases upward (e.g., positive Z direction in FIG. 1). A partition wall 510 may be arranged between adjacent ones of the wavelength conversion portions 501, 502, and 503. The partition wall 510 may include a black matrix for absorbing light, and may improve contrast by preventing crosstalk between the wavelength conversion portions 501, 502, and 503.

Figure 2A:
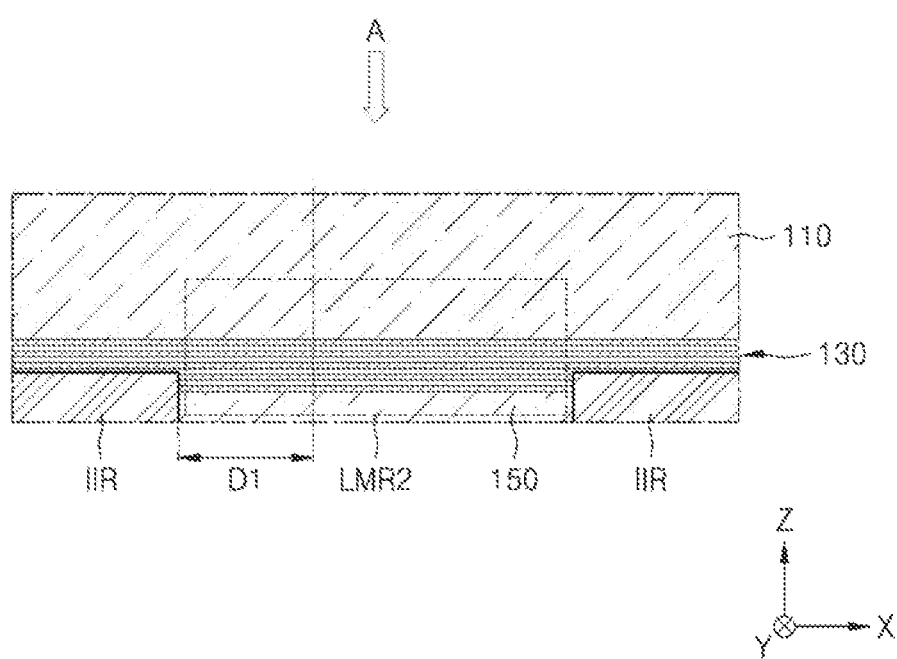
FIGS. 2A and 2B are cross-sectional views for describing a distribution of ions implanted into a light-emitting region.
Figure 2B:
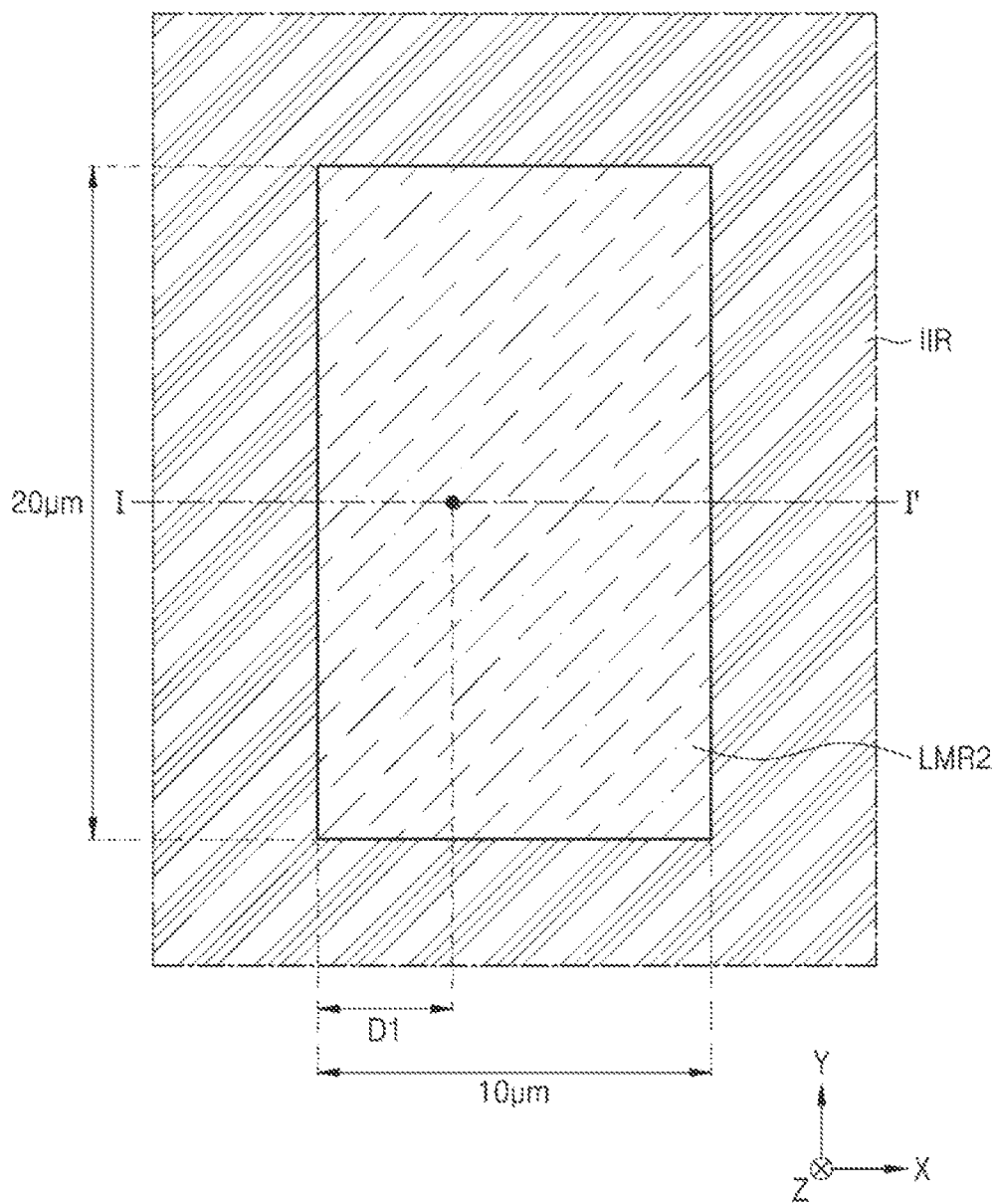

FIGS. 2A and 2B are views for describing an ion distribution of the light-emitting region.

Figure 2C:
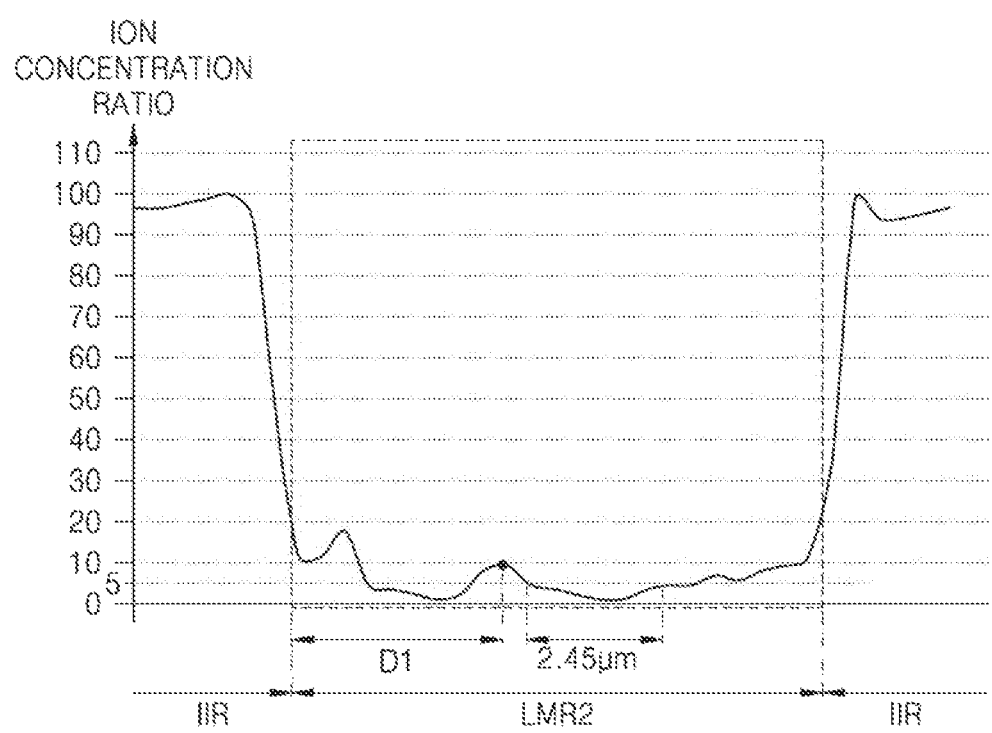
FIG. 2C is a graph of an ion concentration ratio along a line I-I' of FIG. 2B.

FIG. 2A is an enlarged cross-sectional view of the second light-emitting region LMR2 of FIG. 1 and the vicinity thereof, FIG. 2B is a plan view of the second light-emitting region LMR2 of FIG. 1, viewed in an A direction of FIG. 2A, and FIG. 2C is a graph of an ion concentration ratio along a line I-I' of FIG. 2B.

The ion concentration ratio may mean a relative value of an ion concentration at a specific position compared with an area having a maximum ion concentration. For example, an ion concentration ratio 10 means that a concentration of ions is 1/10 compared with an ion concentration ratio 100 of an area having the maximum ion concentration (located at the ion implantation region IIR). When an ion concentration changes in a depth direction (Z direction), the ion concentration ratio may be represented by a value that is the greatest among ion concentrations measured in the depth direction. For example, the ion concentration ratio at position D1 in FIGS. 2A and 2B may be the greatest value among values measured in a depth direction (Z direction) at the position D1. The position D1 may be a position spaced apart from a contact surface of the ion implantation region IIR and the second electrode ED2 toward the ion implantation region IIR.

Referring to FIG. 2B, the second light-emitting region LMR2 may have a width of 1 μm to 200 μm in an X direction and a Y direction, for example, a width in the X direction may be 10 μm and a width in the Y direction may be 20 μm.

Referring to FIG. 2C, the ion concentration ratio has a distribution that is the greatest in the ion implantation region IIR and decreasing toward the center of the second light-emitting region LMR2. In other words, a concentration of ions in the light-emitting region LMR2 may be less than a concentration of ions in the ion implantation region IIR. Assuming that the light-emitting region is set to an area having an ion concentration ratio of 20 or less, an average ion concentration ratio of the second light-emitting region LMR2 may be 2 to 15, or 4 to 10. As described below with reference to FIG. 4B, as an ion implantation process is optimized such that minimal ions are implanted into the light-emitting region, the ion concentration ratios of the first, second, and third light-emitting regions LMR1, LMR2, and LMR3 of FIG. 1 may be less than those of light-emitting regions manufactured in a typical ion implantation process. The second light-emitting region LMR2 may include a continuous section of 1 μm or more along the line I-I' in which an ion concentration ratio is 5 or less.

Figure 3A:
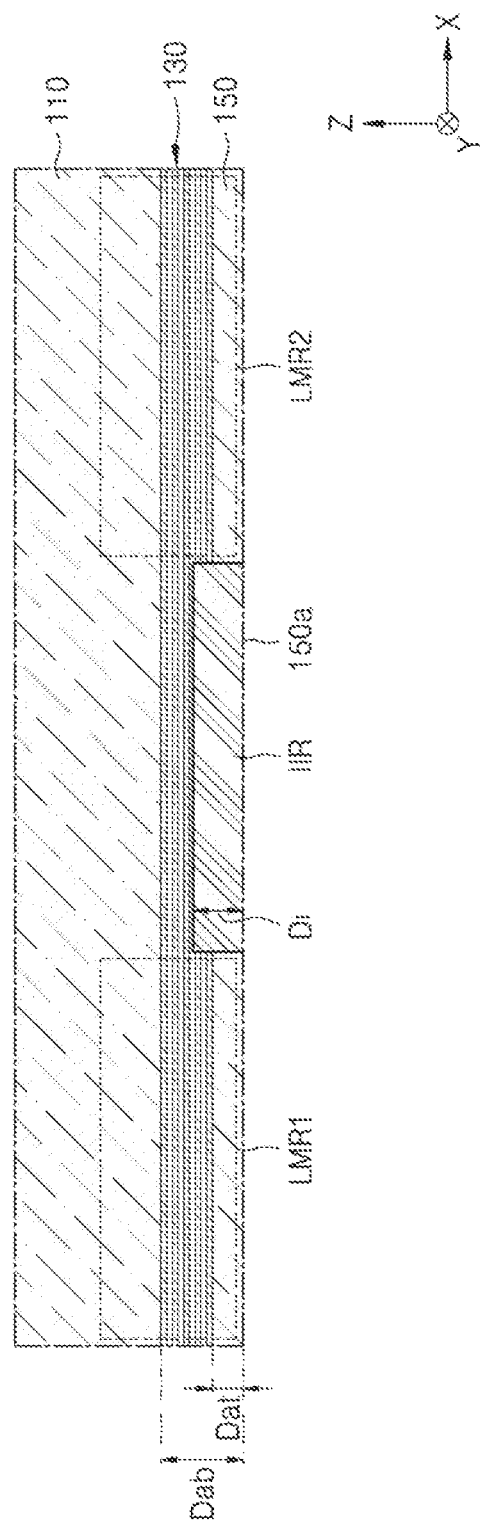
FIGS. 3A and 3B are views for describing ion distribution in an ion implantation region in a depth direction.
Figure 3B:
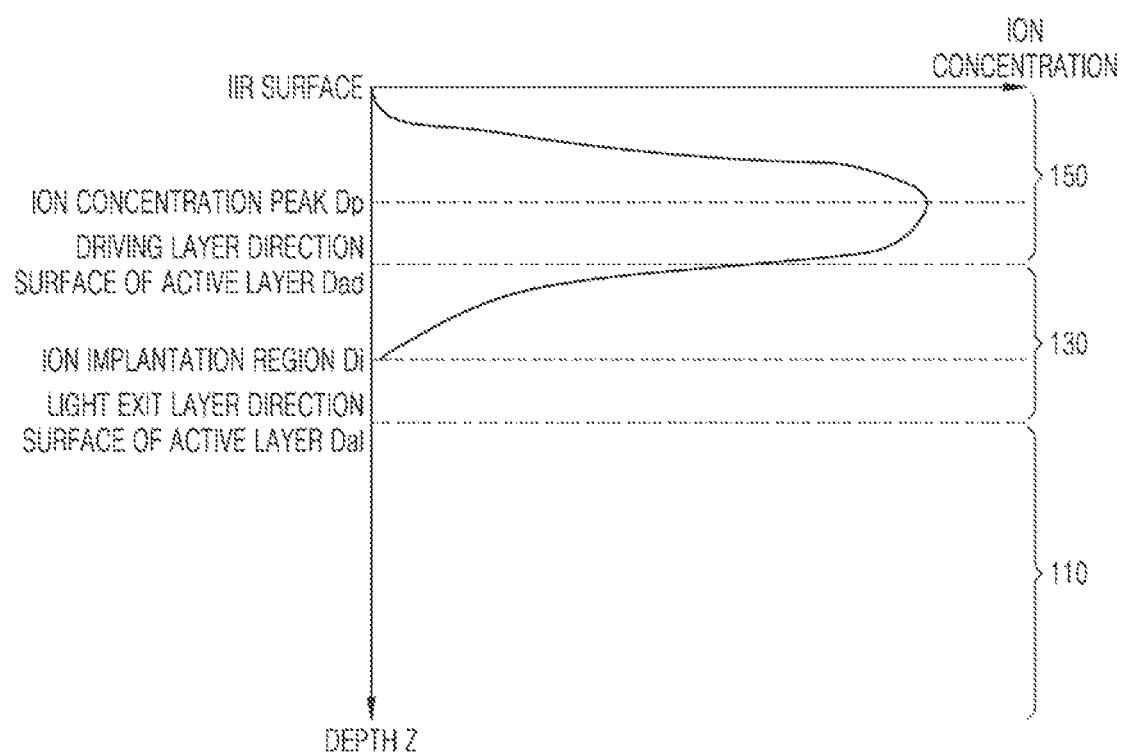

FIGS. 3A and 3B are views for describing the ion distribution of the ion implantation region IIR in the depth direction.

FIG. 3A is an enlarged cross-sectional view of the ion implantation region IIR arranged between the first and second light-emitting regions LMR1 and LMR2 of FIG. 1. FIG. 3B is a view of an ion distribution measured at a center of the ion implantation region IIR of FIG. 3A in the depth direction.

Referring to FIG. 3A, a thickness Di of the ion implantation region IIR may be greater than a depth Dat of a driving layer direction surface Dad of the active layer 130 and less than a depth Dab of a light exit surface direction surface Dal of the active layer 130. The thickness Di and the depths Dat and Dab are set with respect to a lower surface 150a of the second semiconductor layer 150. The thickness Di of the ion implantation region IIR may be the maximum depth in an area having an ion concentration ratio of 1 or more.

Referring to FIG. 3B, the depth of a position where a concentration of implanted ions becomes the maximum, that is, an ion concentration peak Dp, may be less than the thickness of the second semiconductor layer 150, that is, the depth Dat of the driving layer direction surface Dad of the active layer 130. When the depth of the ion concentration peak Dp is greater than the depth Dat of the driving layer direction surface Dad of the active layer 130, that is, when a position where the ion concentration becomes a peak is located at the active layer 130 or the first semiconductor layer 110 as illustrated in FIG. 3B, the light emission efficiency of the first, second, and third light-emitting regions LMR1, LMR2, and LMR3 may be low. For the partition of the first and second light-emitting regions LMR1 and LMR2, the depth of the ion concentration peak Dp may be greater than a distance (Dad−Dp) from the ion concentration peak Dp to the driving layer direction surface Dad of the active layer 130.

A method of manufacturing a display device is described below.

FIGS. 4A to 4L are views for describing a method of manufacturing the display device of FIG. 1.

Figure 4A:
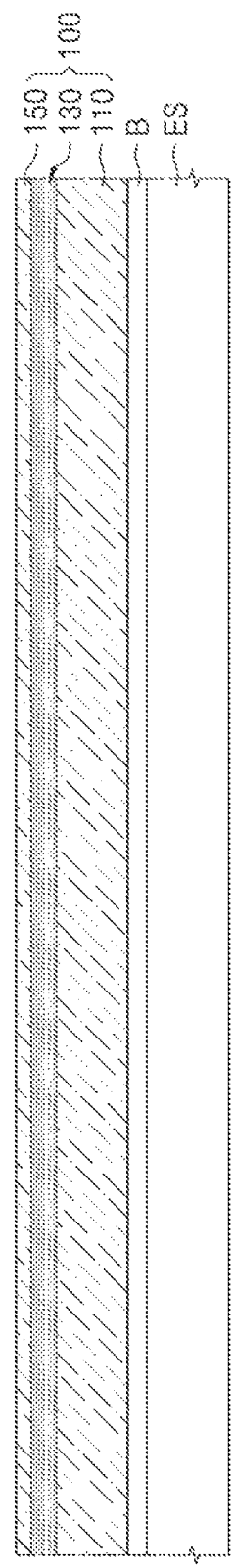

Referring to FIG. 4A, the first semiconductor layer 110, the active layer 130, and the second semiconductor layer 150 may grow in an epitaxial substrate ES. The epitaxial substrate ES may include, for example, a silicon substrate or a sapphire substrate. The first semiconductor layer 110 may be a p-type or n-type semiconductor layer, and a case of an n-type semiconductor layer is described below as an example. The first semiconductor layer 110 may include n-type GaN. The active layer 130 may include GaN. A buffer layer B may be further formed between the epitaxial substrate ES and the first semiconductor layer 110. The buffer layer B may include a single layer or multilayer structure, and the first semiconductor layer 110 may help growth. The buffer layer B may include, for example, AlN. An undoped semiconductor layer (not shown), for example, u-GaN, may be further provided between the buffer layer B and the first semiconductor layer 110.

Referring to FIG. 4B, the ion implantation region IIR that partitions the active layer 130 into a plurality of light-emitting regions may be formed through ion implantation. A mask M for exposing a position where the ion implantation region IIR is to be formed is formed, and ions are implanted to a certain depth of the second semiconductor layer 150 and the active layer 130 to form the ion implantation region IIR.

The mask M may include a metal mask, for example, a Ti mask, and the thickness of the mask M may be 20 nm to 500 nm, 100 nm to 300 nm, or 200 nm to 250 nm. As the thickness of the mask M decreases, the amount of ions implanted into a light-emitting region by being reflected by a sidewall of the mask M is decreased, and thus, the mask M may be thin enough such that ions are not reflected by the sidewall of the mask M.

The implanted ions may include, for example, argon (Ar) ions, or other elements heavier than nitrogen (N) ions. An ion implantation concentration may be $10^{12}$ ions/cm$^2$ to $10^{20}$ ions/cm$^2$, and an ion implantation angle may be 0°.

During ion implantation, a process temperature may be 75° C. to 130° C., or 90° C. to 110° C. When a process temperature is high during ion implantation, ions may collide with a semiconductor material, and thus, mobile vacancy may be generated in the semiconductor layer. As the mobile vacancy may reduce the light efficiency of a light-emitting region, the ion implantation process may be performed at an appropriate temperature.

Table 1 below shows a result of a measurement of the luminance characteristics of display devices by changing the process temperature of an ion implantation process. The measurement was performed by implanting Ar ions using a Ti mask having a thickness of 200 nm, at a concentration of 2E12 ions/cm$^2$ and an implantation angle of 0°.

TABLE 1

|  | 3600/7200 ppi | 3600/7200 ppi | 300/600 ppi | 900/1200 ppi |
|---|---|---|---|---|
| Room temperature | Medium high | Medium low | Medium | Medium |
| 100° C. | High | High | High | High |
| 150° C. | Medium low | Medium low | Medium | Medium |
| 200° C. | Low | Low | Medium low | Medium low |

In Table 1, the first column at the left denotes process temperatures of an ion implantation process, and the top row denotes resolutions of a manufactured display device. In Table 1, "High" denotes that the luminance of a display is relatively high compared with other test results, and "Low" denotes that the luminance thereof is relatively low. Referring to Table 1, compared with display devices that undergo the ion implantation process at room temperature, 150° C., and 200° C., a display device that undergoes the ion implantation process at 100° C. shows improved luminance characteristics at all resolutions.

Table 2 below shows a result of a comparison of the luminance characteristics of display devices by changing an ion implantation concentration and ion implantation energy (acceleration energy).

TABLE 2

|  | 5 keV | 6 keV | 7 keV | 8 keV | 10 keV | 11 keV | 14 KeV |
|---|---|---|---|---|---|---|---|
| 1E13 ions/cm$^2$ | High | — | — | Medium | — | — | — |
| 5E13 ions/cm$^2$ | High | High | High | — | — | — | — |
| 1E14 ions/cm$^2$ | High | High | — | Low | Low | — | — |
| 1E15 ions/cm$^2$ | Low | Low | — | — | — | — | — |
| 1E16 ions/cm$^2$ | Low | — | — | — | — | — | — |

In Table 2, the first column at the left denotes an ion implantation concentration, and the top row denotes ion implantation energy. The measurement was performed by implanting Ar ions using a Ti mask having a thickness of 200 nm, at an implantation angle of 7°.

Referring to Table 2, it may be seen that, when the ion implantation concentration is 1E15 ions/cm$^2$ or less, the luminance characteristics are deteriorated regardless of the implantation energy, and when the implantation energy is 8 keV or more, the luminance characteristics are deteriorated regardless of the ion implantation concentration. In other words, it may be seen that, to secure good luminance characteristics of a display device, the ion concentration in an ion implantation process is less than 1E15 ions/cm$^2$ and the implantation energy is less than 8 keV.

The amount of ion implantation energy may be proportional to the depth of the ion concentration peak Dp of FIG. 3B. For example, when the ion implantation energy is relatively great, the depth of the ion concentration peak Dp may increase, and when the ion implantation energy is relatively small, the depth of the ion concentration peak Dp may decrease. When the implantation energy is less than 8 keV, the depth of the ion concentration peak Dp may be, as described in FIG. 3B, less than the maximum depth of the second semiconductor layer 150, that is, the depth of the driving layer direction surface Dad of the active layer 130.

Although FIG. 4B illustrates an example in which the ion implantation region IIR is formed in a part of the second semiconductor layer 150 and the active layer 130, the thickness of the ion implantation region IIR may be determined in various ways. For example, the ion implantation region IIR may be formed to a depth from the second semiconductor layer 150 to a part of the first semiconductor layer 110.

A plurality of light-emitting regions are formed by being partitioned by the ion implantation region IIR, and a micro light-emitting structure array, for example, a micro LED array, may be implemented.

When a light-emitting region is electrically partitioned by forming the ion implantation region IIR, the light emission efficiency may be improved compared with a structure in which the light-emitting region is partitioned by a physical method such as etching and the like. In the case of a physical partitioning method, the light efficiency is deteriorated by a defect generated in an edge portion of the active layer 130 in an etching process. However, in the ion implantation method, the deterioration of the light efficiency due to a side surface defect is less. Furthermore, as current spreading toward an adjacent light-emitting region is prevented by the ion implantation region IIR, local contrast degradation generated as light is undesirably emitted to an adjacent emission unit may be reduced when compared, for example, to a horizontal type mesa-free structure in which structural partitioning between emission units is not made.

Figure 4C:
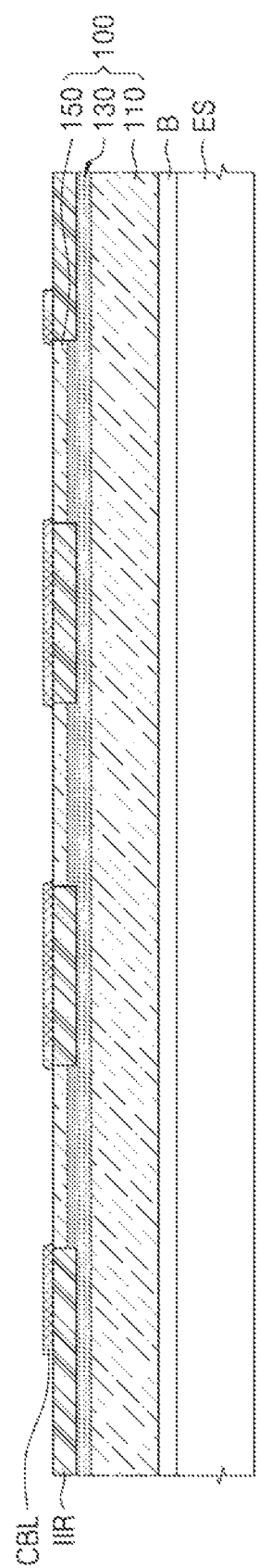

Referring to FIG. 4C, the current blocking layer CBL may be deposited on the ion implantation region IIR. The current blocking layer CBL may be formed by a photoresist and etching process. The current blocking layer CBL may include an insulating material and electrically insulate first electrodes to be formed later. The current blocking layer CBL may be omitted.

Figure 4D:
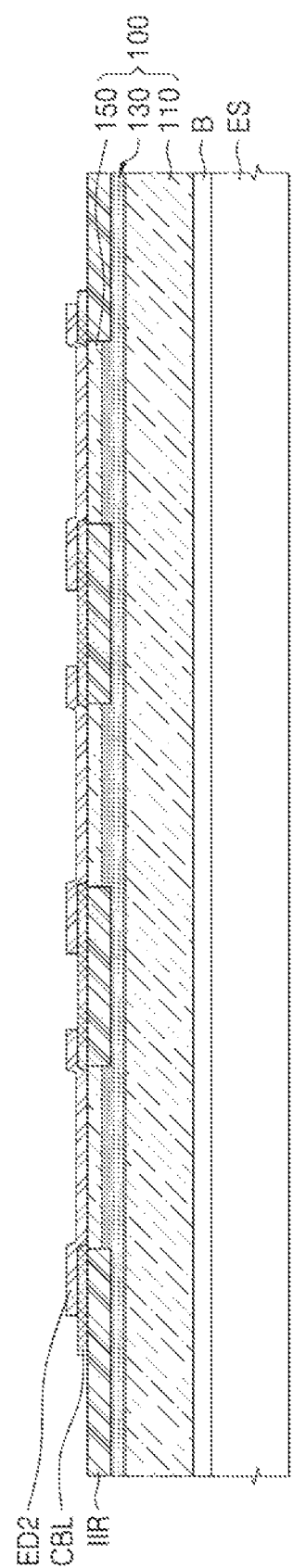

Referring to FIG. 4D, a conductive material may be deposited on the structure of FIG. 4C and the second electrode ED2 partitioned in units of light-emitting regions may be formed through etching. The second electrode ED2 may include pixel electrodes operating in units of light-emitting regions. The second electrode ED2 may include an opaque electrode including a material that is conductive and reflective, for example, Ag, Au, Al, Cr, Ni, and/or an alloy of two or more thereof.

Figure 4E:
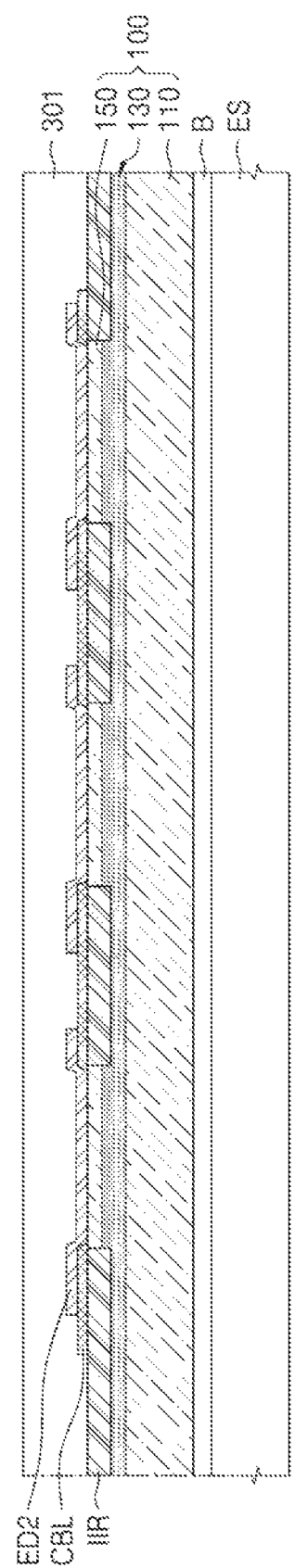

Referring to FIG. 4E, a first insulating layer 301 may be formed to cover the second electrode ED2. The first insulating layer 301 may include, for example, $SiO_2$, SiN, $Al_2O_3$, or $TiO_2$.

Figure 4F:
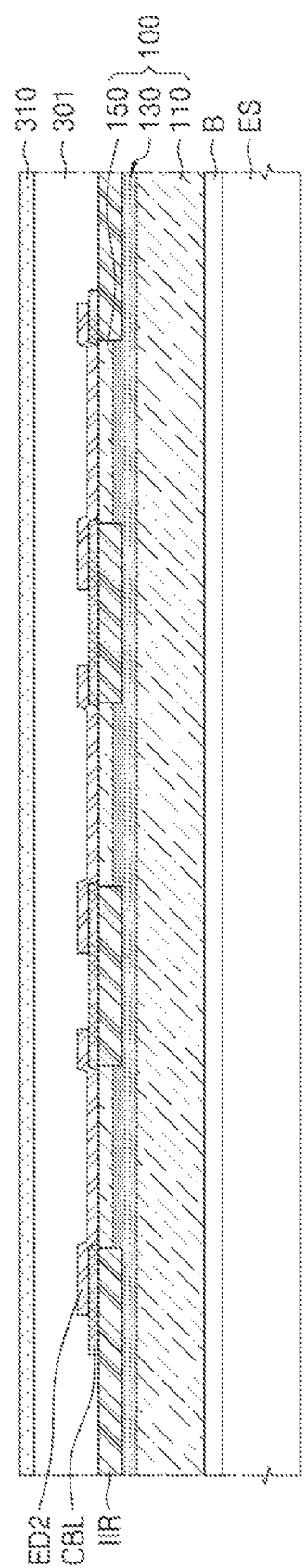

Referring to FIG. 4F, the active layer 310 capable of manufacturing a device such as TFT and the like is formed on the first insulating layer 301. The active layer 310 may include a Si layer.

Figure 4G:
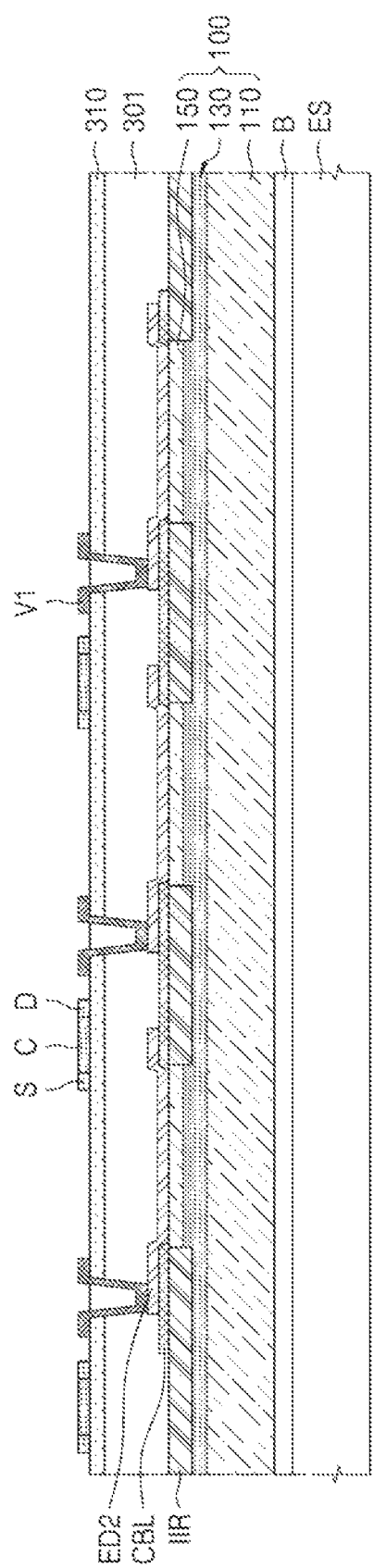
Figure 41:
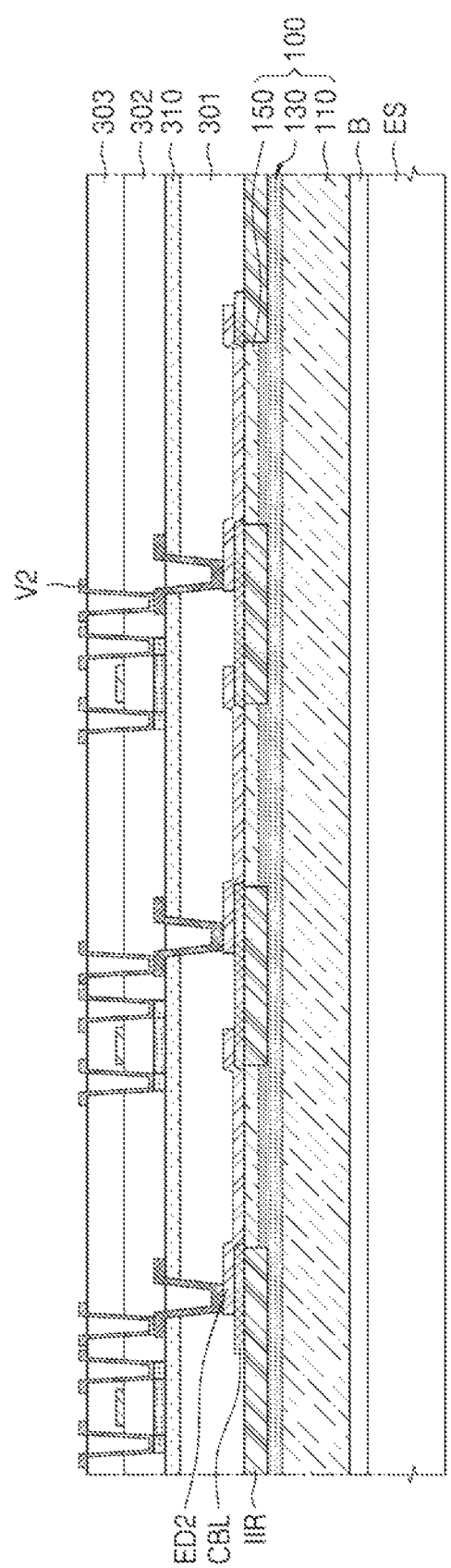

Referring to FIG. 4G, a source S, a channel C, and a drain D may be formed on the active layer 310 through impurities injection and the like, and a via V1 penetrating the first insulating layer 301 may be formed.

Referring to FIG. 4H, a second insulating layer 302 may be formed on the active layer 310, and a gate G, a gate wiring/interconnection, and the like may be formed on the second insulating layer 302.

Referring to FIG. 4I, a third insulating layer 303 may be formed on the second insulating layer 302, and a via V2 and wiring/interconnections, which are connected to a TFT and the second electrode ED2, are formed, thereby forming a driving layer.

Figure 4J:
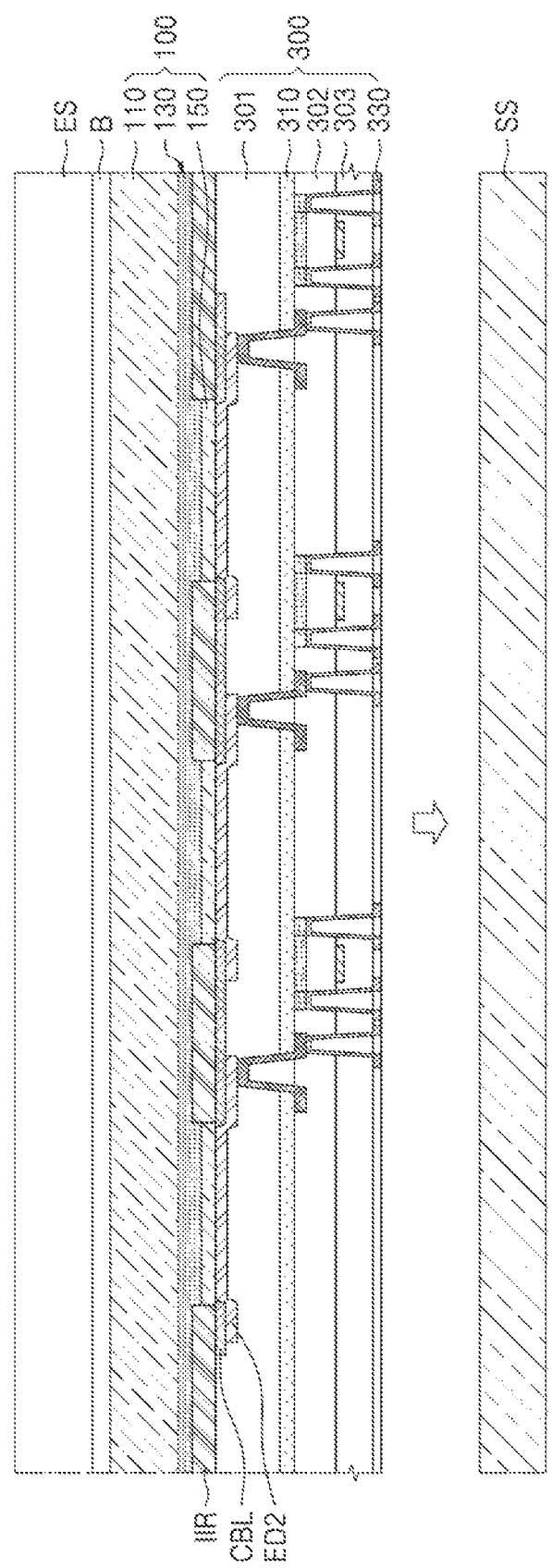
Figure 4K:
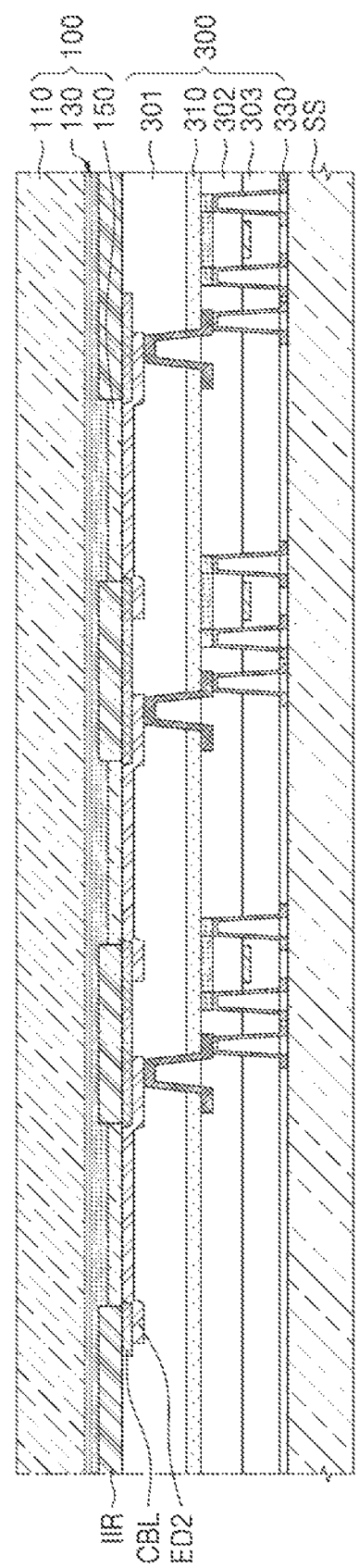

Referring to FIGS. 4J and 4K, the structure of FIG. 4I may be turned over so that the epitaxial substrate ES faces upward, and the support substrate SS for supporting may be arranged at a position facing the third insulating layer 303. The support substrate SS may support the structure of FIG. 4I and include, for example, a silicon substrate, a glass substrate, a sapphire substrate, or a silicon substrate coated with $SiO_2$, which uses various materials and is easily bonded to the third insulating layer 303. Referring to FIG. 4K, the support substrate SS and the third insulating layer 303 may be bonded to each other by the bonding layer 330. The bonding layer 330 may include, for example, an adhesive layer, a direct bonding layer, and the like. The bonding layer 330 may have a thickness of, for example, 0.1 nm to 10 μm.

After the support substrate SS is bonded to the third insulating layer 303, the epitaxial substrate ES may be removed. The epitaxial substrate ES may be removed by, for example, a laser liftoff method, a polishing method, and the like. The polishing method may be used with a dry etching method. For example, when the epitaxial substrate ES is a sapphire substrate, the epitaxial substrate ES may be removed by a laser liftoff method, and when the epitaxial substrate ES is a silicon substrate, the epitaxial substrate ES may be removed by a polishing method. The polishing method may use, for example, a chemical mechanical polishing (CMP) process.

The buffer layer B may be optionally removed. FIG. 4K illustrates an example in which the buffer layer B is removed. The thickness of the first semiconductor layer 110 may be reduced by an etching or polishing process. For example, the first semiconductor layer 110 may have a thickness of 0.5 μm to 3.0 μm.

Figure 4L:
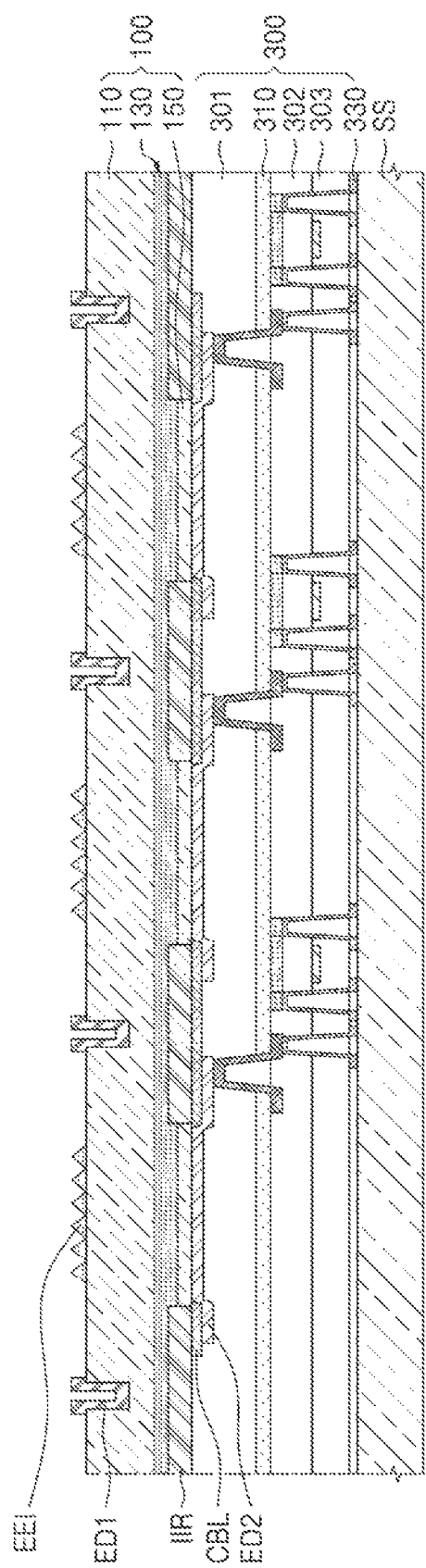

Referring to FIG. 4L, the first electrode ED1 may be formed on the first semiconductor layer 110. The first electrode ED1 may include an opaque electrode. A window area through which light is emitted may be formed by etching the first electrode ED1, and the uneven structure EEI for improving the light emission efficiency may be formed in the window area. Then, a polarization layer 111 may be formed on a light exit surface of the first semiconductor layer 110, and the wavelength conversion layer 500 may be formed thereon, thereby manufacturing the display device 1000 of FIG. 1.

Figure 5:
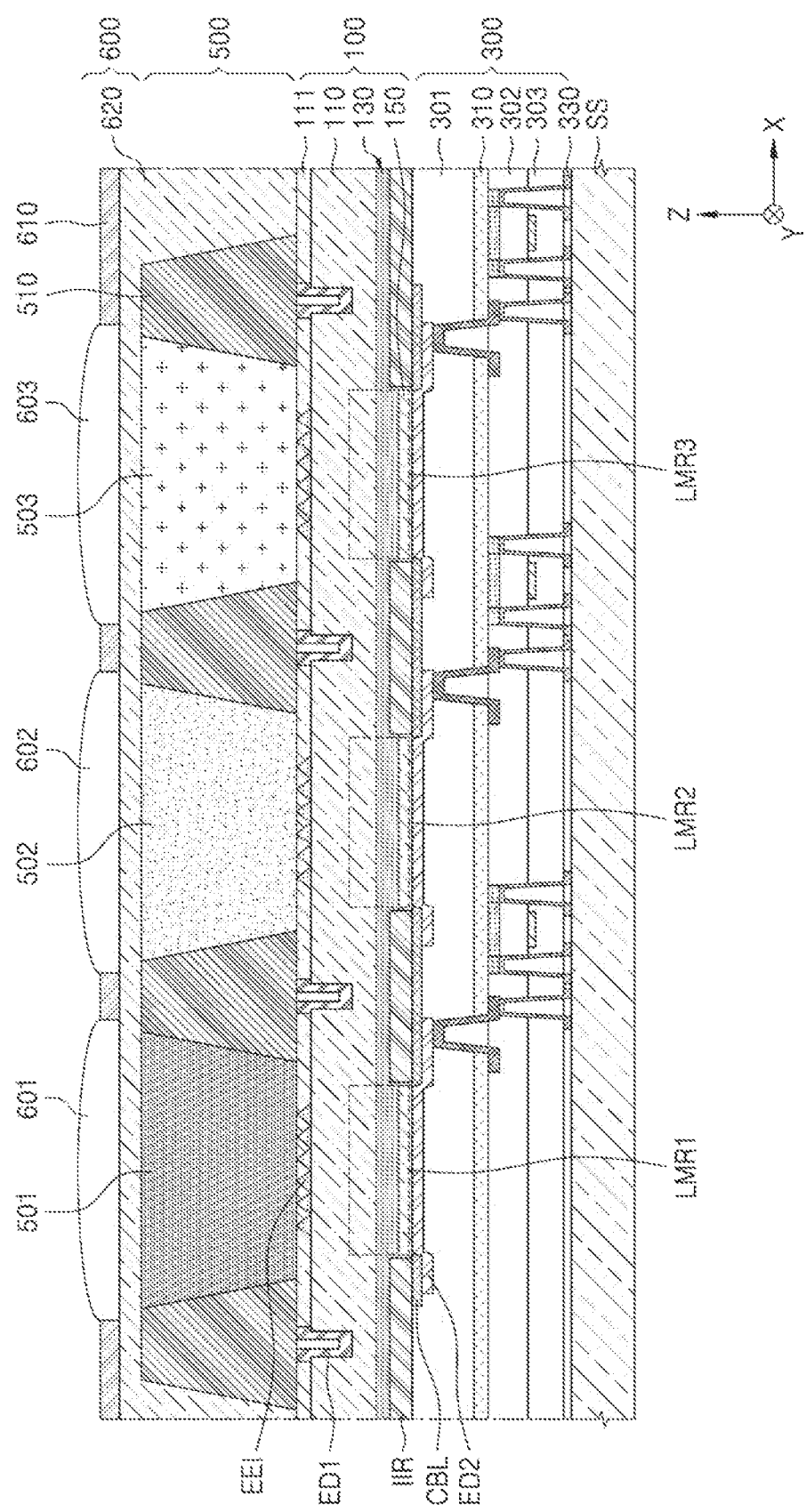
FIG. 5 is a cross-sectional view of a display device obtained by adding a color filter layer to the display device of FIG. 1.

FIG. 5 is a cross-sectional view of a display device obtained by adding a color filter layer 600 to the display device 1000 of FIG. 1. As a constituent element using the same reference number as in FIG. 1 has substantially the same function and configuration as those described in FIG. 1, a detailed description thereof is omitted.

The color filter layer 600 may be arranged on a wavelength conversion layer 500, and may include color filters 601, 602, and 603 respectively corresponding to the wavelength conversion portions 501, 502, and 503. The color filters 601, 602, and 603 may increase color purity by preventing mixing of light beams of undesired wavelengths by transmitting only a corresponding color. A black matrix 610 may be arranged between the color filters 601, 602, and 603. A protection layer 620 functioning as a polarization layer may be further provided between the wavelength conversion layer 500 and the color filter layer 600.

The display device 1000 with high resolution and refresh rate as described above may be employed in various high-performance electronic apparatuses. An electronic apparatus may include, for example, AR/VR glasses, smart phones, mobile phones, cellular phones, personal digital assistants (PDAs), laptops, personal computers (PCs), various portable devices, home appliances, security cameras, medical cameras, vehicles, Internet of Things (IoT) devices, and other mobile or non-mobile computing devices.

The electronic apparatus may further include a processor, for example, an application processor (AP), for controlling the display device 1000, in addition to the display device 1000, and control a plurality of hardware or software constituent elements by driving an operating system or an application program through the processor, and perform various data processes and operations. The processor may further include a graphics processing unit (GPU) and/or an image signal processor. When the processor includes an image signal processor, an image (or video) obtained by using an image sensor may be stored and/or output by using the processor.

Figure 6:
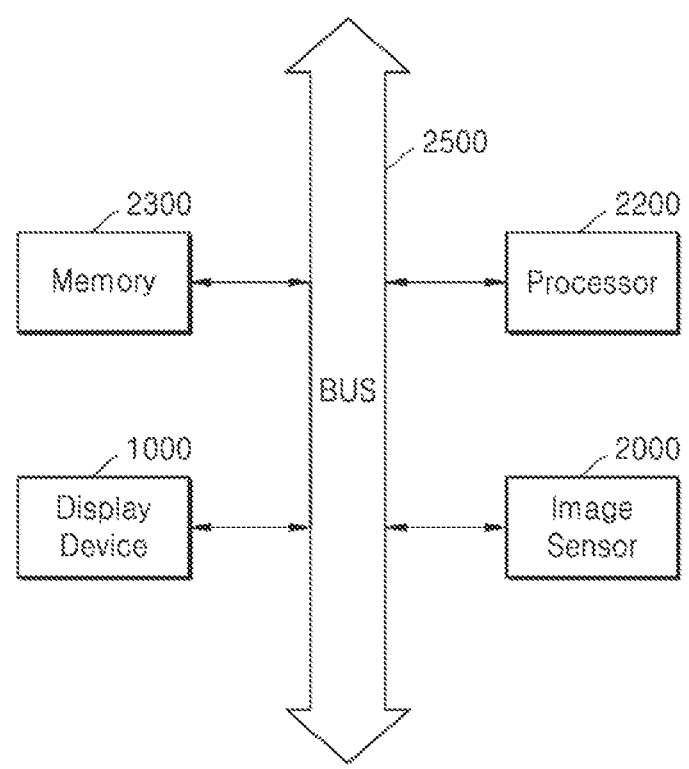
FIG. 6 is a schematic block diagram of an electronic apparatus including a display device according to embodiments.

FIG. 6 is a schematic block diagram of an electronic apparatus including the display device 1000, according to embodiments. The electronic apparatus may include the display device 1000, a processor 2200, a memory 2300, an image sensor 2000, and a bus 2500. The display device 1000 may output image information stored in the memory 2300. The processor 2200 may store the image information in the memory 2300 or transmit the image information to the display device 1000, through the bus 2500. Furthermore, as described above, the processor 2200 may perform various image processing on the image information provided by the image sensor 2000. The display device 1000 may include the display device described with reference to FIG. 1.

Figure 7:
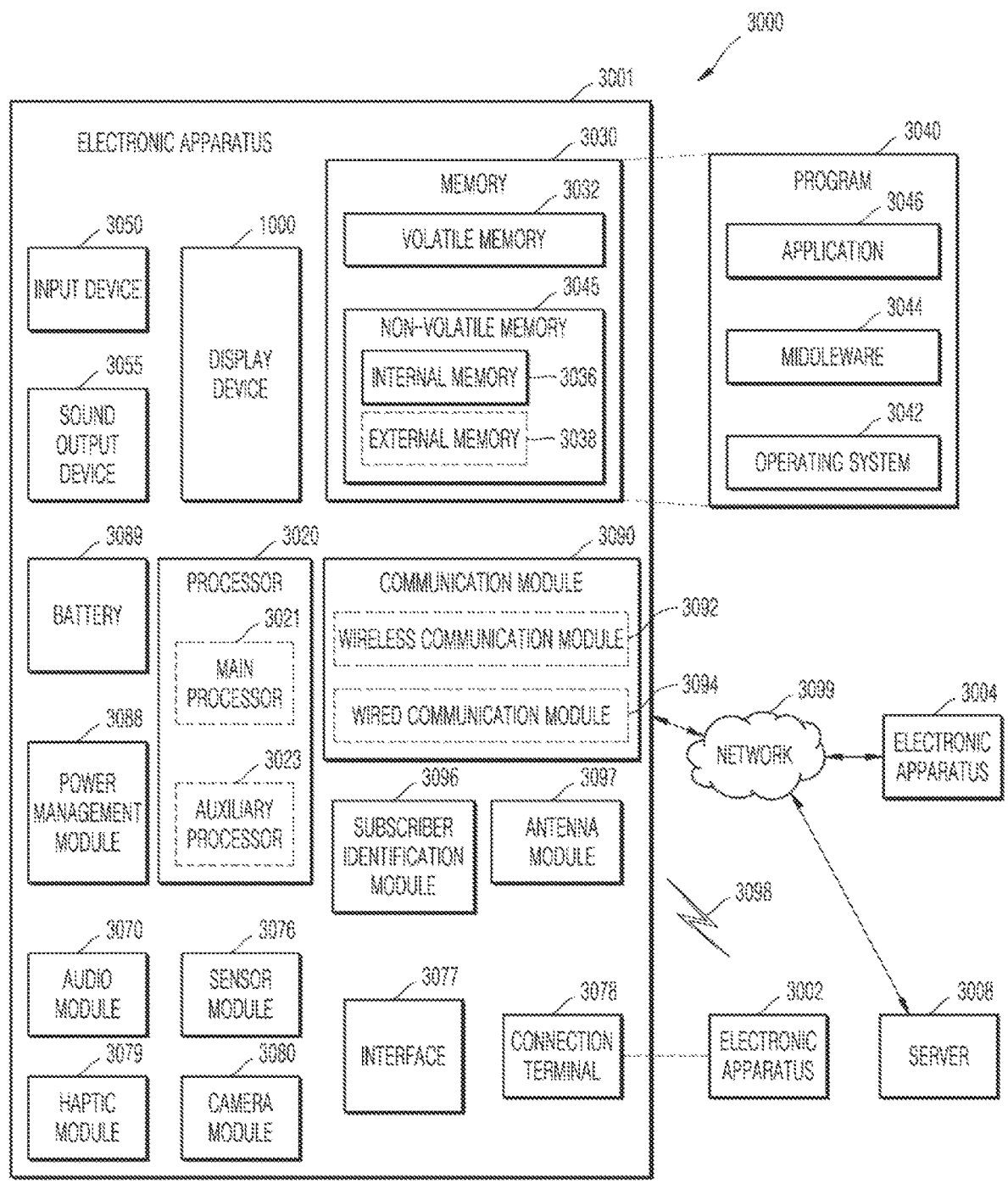
FIG. 7 is a block diagram of an example of an electronic apparatus including a display device.

FIG. 7 is a block diagram of an example of an electronic apparatus 3001 including the display device 1000. Referring to FIG. 7, in a network environment 3000, the electronic apparatus 3001 may communicate with another electronic apparatus 3002 through a first network 3098 (a short-range wireless communication network, and the like), or communicate with another electronic apparatus 3004 and/or a server 3008 through a second network 3099 (a long-range wireless communication network and the like). The electronic apparatus 3001 may communicate with the electronic apparatus 3004 through the server 3008. The electronic apparatus 3001 may include a processor 3020, a memory 3030, an input device 3050, a sound output device 3055, the display device 1000, an audio module 3070, a sensor module 3076, an interface 3077, a haptic module 3079, a camera module 3080, a power management module 3088, a battery 3089, a communication module 3090, a subscriber identification module 3096, and/or an antenna module 3097. In the electronic apparatus 3001, some (a communication module 3090 and the like) of the constituent elements or others may be omitted, or other constituent elements may be added. Some of the constituent elements may be implemented by one incorporated circuit. For example, the sensor module 3076 (a fingerprint sensor, an iris sensor, an illuminance sensor, and the like) may be implemented by being embedded in the display device 1000.

The processor 3020 may control, by executing software (a program 3040 and the like), one or a plurality of other constituent elements (hardware, software constituent elements, and the like) of the electronic apparatus 3001, which are connected to the processor 3020, and perform various data processing or operations. As part of the data processing or operations, the processor 3020 may load commands and/or data received from other constituent elements (the sensor module 3076, the communication module 3090, and the like) in a volatile memory 3032, process the commands and/or data stored in the volatile memory 3032, and store resultant data in a non-volatile memory 3045. The processor 3020 may include a main processor 3021 (a central processing unit, an application processor, and the like) and an auxiliary processor 3023 (a graphics processing unit, an image signal processor, a sensor hub processor, a communication processor, and the like) that are operated independently of or together with the main processor 3021. The auxiliary processor 3023 may use less power than the main processor 3021 and may perform a specialized function.

The auxiliary processor 3023 may control a function and/or state related to some constituent elements (the display device 1000, the sensor module 3076, the communication module 3090, and the like) of the constituent elements of the electronic apparatus 3001, instead of the main processor 3021 while the main processor 3021 is in an inactive state (sleep state), or with the main processor 3021 while the main processor 3021 is in an active state (application execution state). The auxiliary processor 3023 (an image signal processor, a communication processor, and the like) may be implemented as a part of functionally related other constituent elements (the camera module 3080, the communication module 3090, and the like).

The memory 3030 may store various pieces of data needed by some constituent elements (the processor 3020, a sensor module 3076, and the like) of the electronic apparatus 3001. The data may include, for example, software (the program 3040 and the like) and input data and/or output data regarding commands related thereto. The memory 3030 may include the volatile memory 3032 and/or the non-volatile memory 3045.

The program 3040 may be stored in the memory 3030, as software, and may include an operating system 3042, middleware 3044, and/or an application 3046.

An input device 3050 may receive commands and/or data used in the constituent elements (the processor 3020 and the like) of the electronic apparatus 3001 from the outside (user and the like) of the electronic apparatus 3001. The input device 3050 may include a microphone, a mouse, a keyboard, and/or a digital pen (a stylus pen and the like).

The sound output device 3055 may output a sound signal to the outside of the electronic apparatus 3001. The sound output device 3055 may include a speaker and/or a receiver. The speaker may be used for general purposes such as multimedia playback or recording playback, and the receiver may be used to receive incoming calls. The receiver may be integrated as a part of the speaker or separately implemented as an independent device.

The display device 1000 may visually provide information to the outside of the electronic apparatus 3001. The display device 1000 may include a display, a hologram device, or a projector, and a control circuit for controlling a corresponding device. The display device 1000 may include a touch circuitry set to sense a touch, and/or a sensor circuit (a pressure sensor and the like) set to measure the strength of a force generated by a touch.

The audio module 3070 may convert sound into an electrical signal, or reversely an electrical signal into sound. The audio module 3070 may obtain sound through the input device 3050, or output sound through the sound output device 3055, and/or a speaker and/or a headphone of other electronic apparatuses (the electronic apparatus 3002 and the like) connected to the electronic apparatus 3001 in a wired or wireless manner.

The sensor module 3076 may sense an operation state of the electronic apparatus 3001 (power, a temperature, and the like), or an external environment state (a user state, and the like), and generate an electrical signal and/or a data value corresponding to a sensed state. The sensor module 3076 may include a gesture sensor, a gyro sensor, barometric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

An interface 3077 may support one or a plurality of assigned protocols used for the electronic apparatus 3001 to be connected to other electronic apparatuses (the electronic apparatus 3002 and the like) in a wired or wireless manner. The interface 3077 may include a high definition multimedia interface (HDMI), a universal serial bus (USB) interface, an SD card interface, and/or an audio interface.

A connection terminal 3078 may include a connector to allow the electronic apparatus 3001 to be physically connected to other electronic apparatuses (the electronic apparatus 3002 and the like). The connection terminal 3078 may include an HDMI connector, a USB connector, an SD card connector, and/or an audio connector (a headphone connector and the like).

The haptic module 3079 may convert electrical signals into mechanical stimuli (vibrations, movements, and the like) or electrical stimuli that a user can perceive through tactile or motion sensations. The haptic module 3079 may include a motor, a piezoelectric device, and/or an electrical stimulation device.

The camera module 3080 may capture a still image and a video. The camera module 3080 may include a lens assembly including one or a plurality of lenses, image signal processors, and/or flashes. The lens assembly included in the camera module 3080 may collect light emitted from a subject for image capturing.

The power management module 3088 may manage power supplied to the electronic apparatus 3001. The power management module 3088 may be implemented as a part of a power management integrated circuit (PMIC).

The battery 3089 may supply power to the constituent elements of the electronic apparatus 3001. The battery 3089 may include non-rechargeable primary cells, rechargeable secondary cells, and/or fuel cells.

The communication module 3090 may support an establishment of a wire communication channel and/or a wireless communication channel between the electronic apparatus 3001 and other electronic apparatuses (the electronic apparatus 3002, the electronic apparatus 3004, the server 3008, and the like), and a communication therebetween through the established communication channel. The communication module 3090 may be operated independently of the processor 3020 (an application processor and the like), and may include one or a plurality of communication processor supporting wired communication and/or wireless communication. The communication module 3090 may include a wireless communication module 3092 (a cellular communication module, a short-range wireless communication module, a global navigation satellite system (GNSS) communication module, and the like) and/or a wired communication module 3094 (a local area network (LAN) communication module, a power line communication module, and the like). A corresponding communication module of the communication modules may communicate with other electronic apparatuses through the first network 3098 (a short-range communication network such as Bluetooth, WiFi Direct or infrared data association (IrDA)) or the second network 3099 (a long distance communication network such as a cellular network, the Internet, or a computer network (LAN, WAN, and the like)). These various types of communication modules may be incorporated into one constituent element (a single chip and the like), or implemented by a plurality of constituent elements (a plurality of chips) separated from each other. The wireless communication module 3092 may check and authenticate the electronic apparatus 3001 within a communication network such as the first network 3098 and/or the second network 3099 by using subscriber information (international mobile subscriber identifier (IMSI) and the like) stored in the subscriber identification module 3096.

The antenna module 3097 may transmit/receive a signal and/or power to/from the outside (other electronic apparatuses and the like). An antenna may include an emitter in a conducive pattern formed on a substrate (a PCB and the like). The antenna module 3097 may include one or a plurality of antennas. When the communication module 3090 includes a plurality of antennas, the communication module 3090 may select, from among a plurality of antennas, an antenna suitable for a communication method used for a communication network such as the first network 3098 and/or the second network 3099. A signal and/or power may be transmitted or received between the communication module 3090 and other electronic apparatuses, through a selected antenna. In addition to the antenna, other parts (an RFIC and the like) may be included as a part of the antenna module 3097.

Some of the constituent elements may be connected to each other through a neighboring device communication method (a bus, a general purpose input and output (GPIO), a serial peripheral interface (SPI), a mobile industry processor interface (MIPI), and the like), and may exchange signals (commands, data, and the like) with each other.

The command or data may be transmitted or received between the electronic apparatus 3001 and the electronic apparatus 3004 at the outside, through the server 3008 connected to the second network 3099. Other electronic apparatuses (3002 and 3004) may be the same type as or a different type from the electronic apparatus 3001. All or part of operations performed in the electronic apparatus 3001 may be performed in one or a plurality of devices of other electronic apparatuses (3002, 3004, and 3008). For example, when the electronic apparatus 3001 is to perform a function or service, instead of performing the function or service, it may be possible to request one or a plurality of other electronic apparatuses to perform part or the whole of the function or service. The one or a plurality of other electronic apparatuses that received a request may perform an additional function or service related to the request and transmit a result of the performance to the electronic apparatus 3001. To the end, cloud computing, distributed computing, and/or a client-server computing technology may be used.

Figure 8:
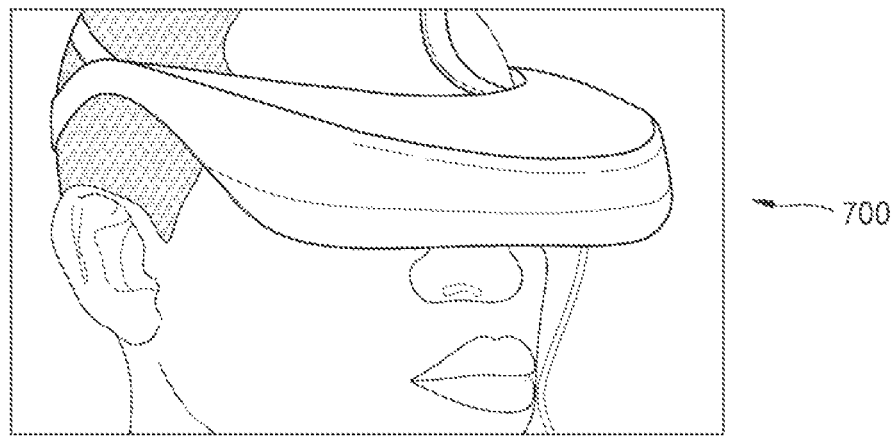
FIGS. 8 to 14 are views of examples of various electronic apparatuses.
Figure 9:
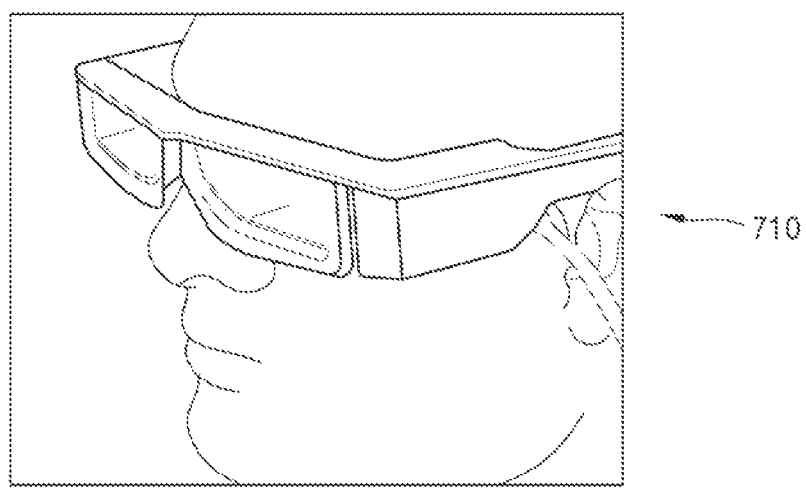
Figure 10:
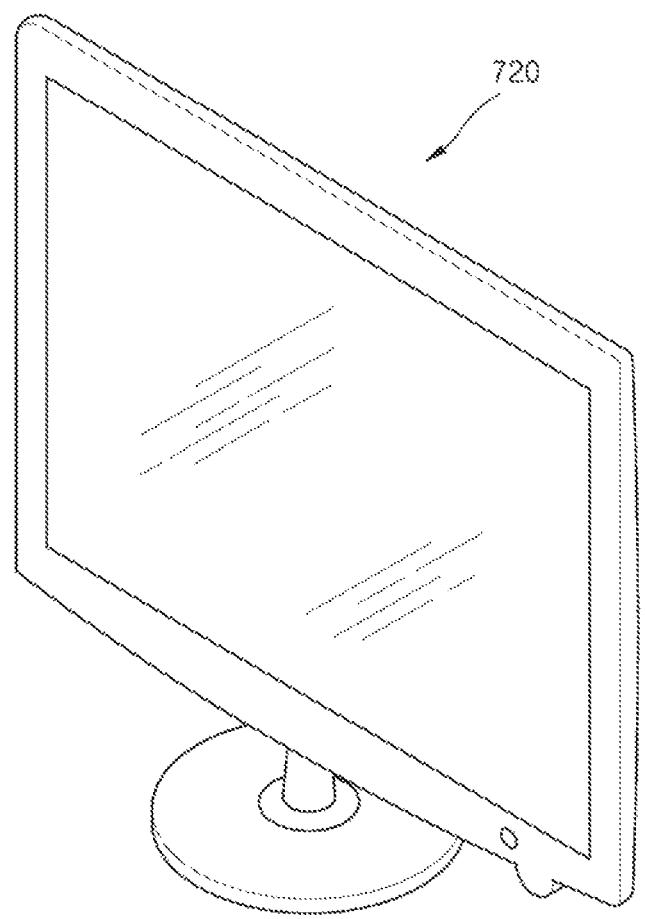
Figure 11:
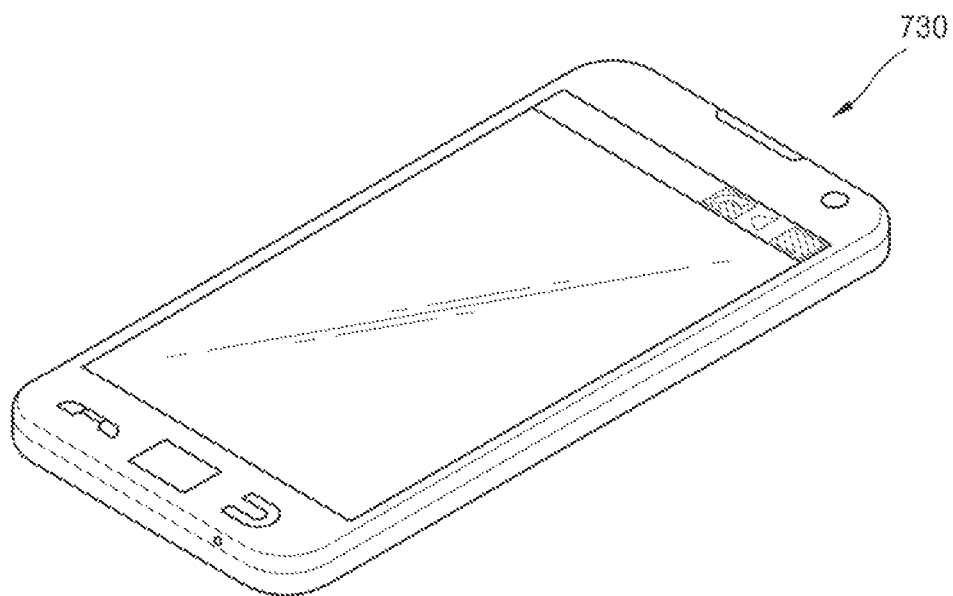
Figure 12:
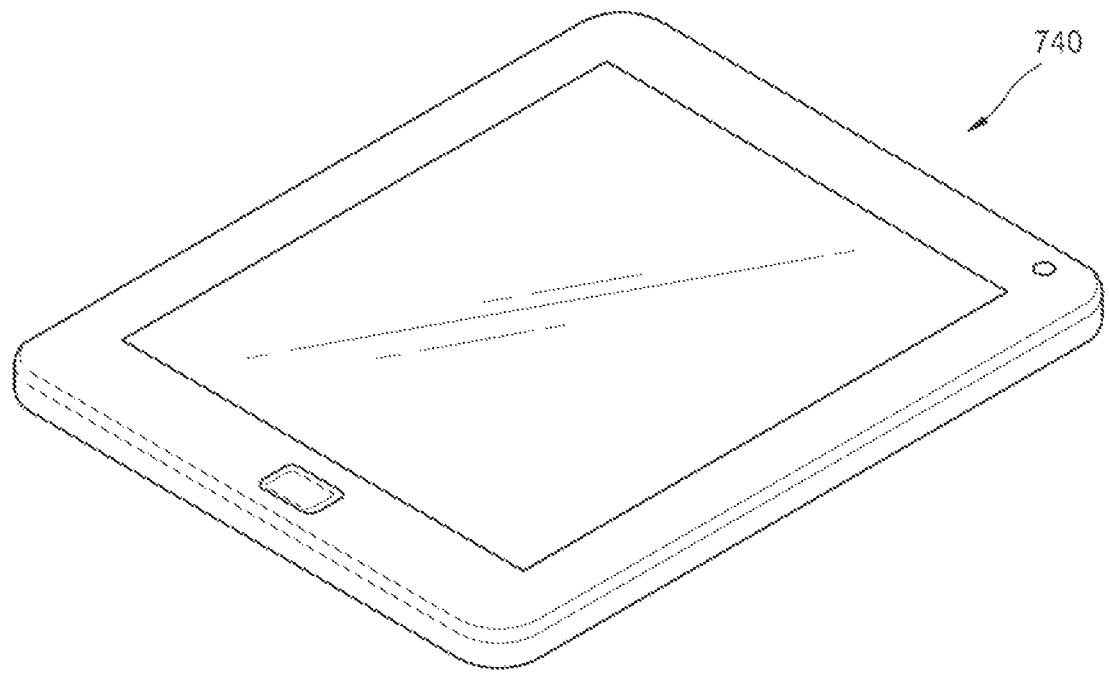

The above-described micro light-emitting display device according to embodiments may be applied to electronic apparatuses of various sizes and various purposes without limitation. For example, FIGS. 8 to 14 illustrate examples of various electronic apparatuses. As illustrated in FIG. 8, a micro light-emitting display device according to various embodiments may be applied to a head mounted display (HMD) 700. As illustrated in FIG. 9, a micro light-emitting display device according to various embodiments may be applied to a compact display panel used in a glasses-type display or goggle-type display 710, and the like. As illustrated in FIG. 10, a micro light-emitting display device according to various embodiments may be applied to a display panel of a television, a smart television, or a computer 720. As illustrated in FIG. 11 a micro light-emitting display device according to various embodiments may be applied to a display panel of a mobile phone or smartphone 730. As illustrated in FIG. 12, a micro light-emitting display device according to various embodiments may be applied to a display panel of a tablet or smart tablet 740.

Figure 13:
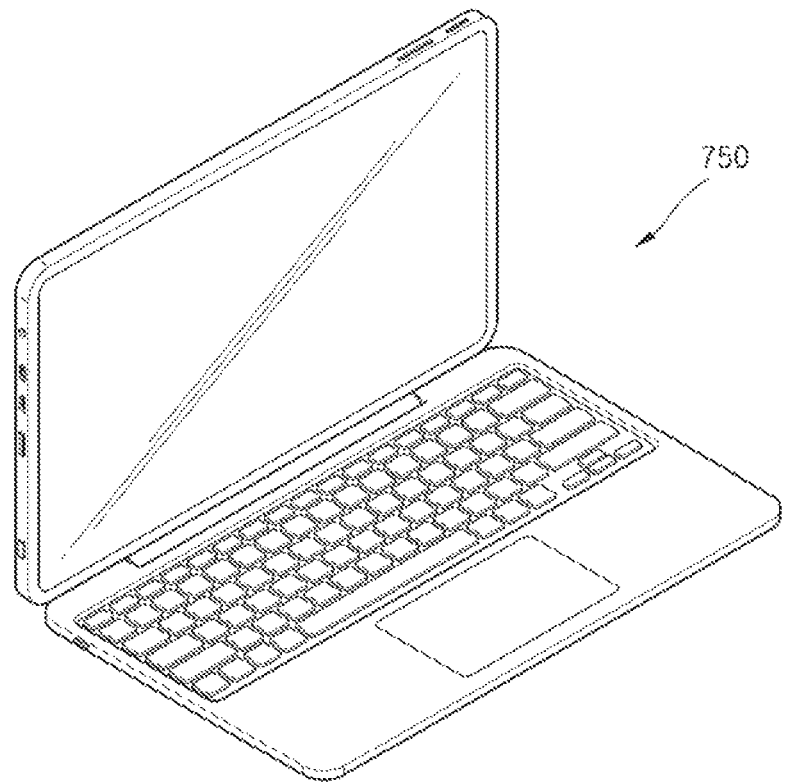
Figure 14:
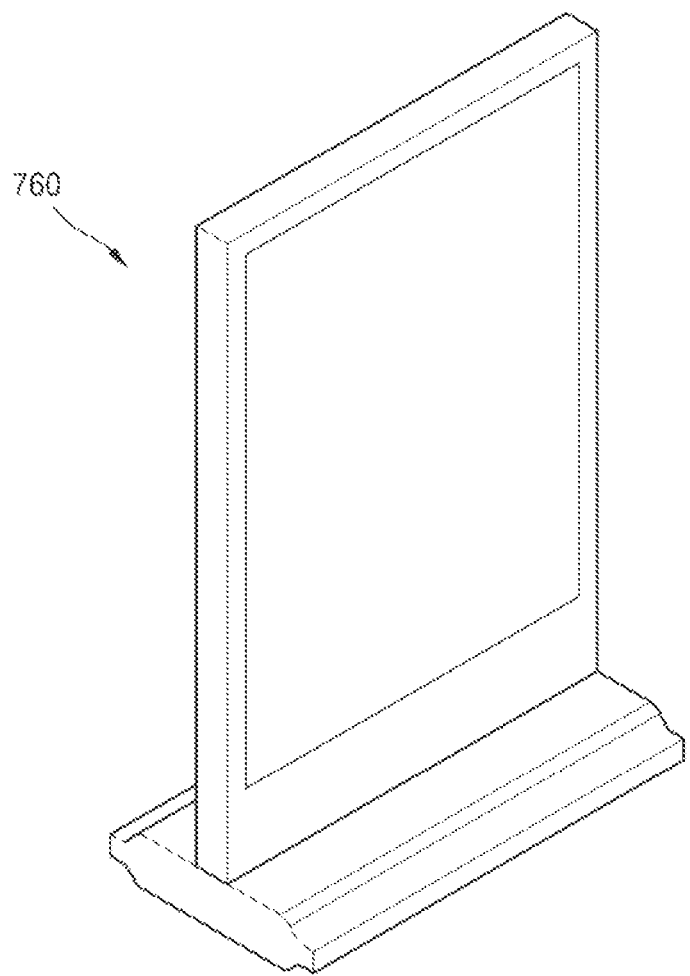

Furthermore, a micro light-emitting display device according to various embodiments may be applied to a display panel of a notebook computer 750, as illustrated in FIG. 13, and to a large display panel used for a signage 760, a large billboard, a theater screen, and the like, as illustrated in FIG. 14.

As the light-emitting diode display device partitions a light-emitting region through ion implantation, an etching process is unnecessary, and thus, a light emission efficiency of a display device may be improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
a first semiconductor layer;
an active layer under the first semiconductor layer;
a second semiconductor layer under the active layer; and
an ion implantation region comprising a plurality of ions,
the ion implantation region partitioning the active layer into a plurality of light-emitting regions,
wherein an average ion concentration ratio of the plurality of light-emitting regions is 2 to 15,
wherein the depth of an ion concentration peak where a concentration of implanted ions is the maximum is less than the thickness of the second semiconductor layer and the depth of the ion concentration peak is greater than a distance from a position of the ion concentration peak to a driving layer direction surface of the active layer.

2. The display device of claim 1, wherein the average ion concentration ratio of the plurality of light-emitting regions is 4 to 10.

3. The display device of claim 1, wherein an ion concentration ratio of each of the plurality of light-emitting regions is 20 or less.

4. The display device of claim 1, wherein each of the plurality of light-emitting regions comprises a continuous section having a length of 1 µm or more in which an ion concentration ratio is 5 or less.

5. The display device of claim 1, wherein each of the plurality of ions has a mass greater than a mass of a nitrogen ion.

6. The display device of claim 1, wherein the plurality of ions comprises Ar ions.

7. The display device of claim 1, wherein the ion implantation region is formed at a process temperature of 75° C. to 130° C.

8. A display device comprising:
a first semiconductor layer;
an active layer under the first semiconductor layer;
a second semiconductor layer under the active layer; and
an ion implantation region in the second semiconductor layer and the active layer to form a first light-emitting region separated from a second light-emitting region,
wherein a concentration peak of ions implanted into the ion implantation region is located at a level below an upper surface of the second semiconductor layer and wherein the depth of an ion concentration peak where a concentration of implanted ions is the maximum is less than the thickness of the second semiconductor layer and the depth of the ion concentration peak is greater than a distance from a position of the ion concentration peak to a driving layer direction surface of the active layer, and
wherein an average ion concentration ratio of the first light-emitting region and the second light-emitting region is 2 to 15.

9. The display device of claim 8, wherein the ion implantation region has an ion distribution that gradually increases and then decreases from a surface of the second semiconductor layer in a direction toward the active layer.

10. The display device of claim 8, wherein each ion of the ions implanted in the ion implantation region has a mass greater than a mass of a nitrogen ion.

11. The display device of claim 8, wherein ions implanted in the ion implantation region comprise Ar ions.

12. The display device of claim 8, wherein the first semiconductor layer comprises an n-type semiconductor layer, and
wherein the second semiconductor layer comprises a p-type semiconductor layer.

13. An electronic apparatus comprising:
a display device configured to output image information; and a processor configured to control an operation of the display device and transmit image information to the display device,
wherein the display device comprises:
a first semiconductor layer;
an active layer under the first semiconductor layer;
a second semiconductor layer under the active layer; and
an ion implantation region comprising a plurality of ions, the ion implantation region partitioning the active layer into a plurality of light-emitting regions, the ion implantation region separating the plurality of light-emitting regions from each other,
wherein the depth of an ion concentration peak where a concentration of implanted ions is the maximum is less than the thickness of the second semiconductor layer and the depth of the ion concentration peak is greater than a distance from a position of the ion concentration peak to a driving layer direction surface of the active layer,
wherein an average ion concentration ratio of the plurality of light-emitting regions is 2 to 15.

14. The electronic apparatus of claim 13, wherein the average ion concentration ratio of the plurality of light-emitting regions is 4 to 10.

15. The electronic apparatus of claim 13, wherein an ion concentration ratio of each of the plurality of light-emitting regions is 20 or less.

16. The electronic apparatus of claim 13, wherein each of the plurality of light-emitting regions comprises a continuous section having a length of 1 µm or more in which an ion concentration ratio is 5 or less.

17. The electronic apparatus of claim 13, wherein each ion of the plurality of ions has a mass greater than a mass of a nitrogen ion.

18. The electronic apparatus of claim 13, wherein the plurality of ions comprises Ar ions.

19. A display device comprising:
a semiconductor layer; an active layer on the semiconductor layer; and
a plurality of ions in the semiconductor layer and the active layer,
wherein a light-emitting region of the display device comprises a first portion of the semiconductor layer and a second portion of the active layer, the second portion being directly in contact with the first portion, and the light-emitting region includes a first light-emitting sub-region and a second light-emitting sub-region;
a second semiconductor layer under the active layer, and
wherein a concentration of the plurality of ions in the light-emitting region is less than a concentration of the plurality of ions in a non-light-emitting region of the display device,
wherein the non-light emitting region separates the first light-emitting sub-region from the second light-emitting sub-region, and
wherein the depth of an ion concentration peak where a concentration of implanted ions is the maximum is less than the thickness of the second semiconductor layer and the depth of the ion concentration peak is greater than a distance from a position of the ion concentration peak to a driving layer direction surface of the active layer,
wherein an average ion concentration ratio of the light-emitting region is 2 to 15.

20. The display device of claim 19, further comprising:
another semiconductor layer on the active layer;
a first electrode in the another semiconductor layer above the non-light-emitting region; and
a second electrode under the light-emitting region and contacting the semiconductor layer.

* * * * *